(12) United States Patent
Matsuda

(10) Patent No.: US 9,615,409 B2
(45) Date of Patent: Apr. 4, 2017

(54) LIGHT EMISSION MODULE, CONNECTOR, AND MOUNTING STRUCTURE FOR LIGHT EMISSION MODULE

(71) Applicant: KANEKA CORPORATION, Osaka-shi, Osaka (JP)

(72) Inventor: Kuniharu Matsuda, Tokyo (JP)

(73) Assignee: KANEKA CORPORATION, Osaka-shi (JP)

( * ) Notice: Subject to any disclaimer, the term of this patent is extended or adjusted under 35 U.S.C. 154(b) by 0 days.

(21) Appl. No.: 15/117,065

(22) PCT Filed: Feb. 3, 2015

(86) PCT No.: PCT/JP2015/052959
§ 371 (c)(1),
(2) Date: Aug. 5, 2016

(87) PCT Pub. No.: WO2015/122319
PCT Pub. Date: Aug. 20, 2015

(65) Prior Publication Data
US 2016/0353530 A1    Dec. 1, 2016

(30) Foreign Application Priority Data

Feb. 13, 2014    (JP) ................................ 2014-025517
Mar. 28, 2014    (JP) ................................ 2014-069115
(Continued)

(51) Int. Cl.
*H05B 33/08*    (2006.01)
*F21V 21/29*    (2006.01)
(Continued)

(52) U.S. Cl.
CPC .............. *H05B 33/08* (2013.01); *F21S 8/043* (2013.01); *F21V 17/105* (2013.01);
(Continued)

(58) Field of Classification Search
CPC ........ F21S 8/00; F21S 8/02; F21S 8/04; F21S 8/046; F21S 2/005; F21Y 2101/02;
(Continued)

(56) References Cited

U.S. PATENT DOCUMENTS 6,469,405 B1 * 10/2002 Moya .................... G09G 3/3283
307/130
8,339,035 B2 * 12/2012 Fukano .............. H05B 33/0896
313/483
(Continued)

FOREIGN PATENT DOCUMENTS

JP    2008235136 A    10/2008
JP    2009021035 A    1/2009
(Continued)

OTHER PUBLICATIONS

International Bureau of WIPO, International Preliminary Report on Patentability Issued in Application No. PCT/JP2015/052959, Aug. 16, 2016, WIPO, 9 pages.
(Continued)

*Primary Examiner* — Haissa Philogene
(74) *Attorney, Agent, or Firm* — Alleman Hall McCoy Russell & Tuttle LLP

(57) ABSTRACT

The present invention provides a light-emitting module capable of absorbing individual differences in organic EL panels that are inevitably generated in manufacture or individual differences between different types of organic EL panels. A connector includes a connection side circuit. The connection side circuit includes a circuit side power supply path that contributes to power supply to a light-emitting panel. The light-emitting panel includes an adjustment element and a light-emitting element. The adjustment element is capable of adjusting an electric resistance value and
(Continued)

electrically connected to the light-emitting element through the circuit side power supply path.

4 Claims, 17 Drawing Sheets

(30) Foreign Application Priority Data

Mar. 28, 2014 (JP) ................. 2014-069116
Mar. 28, 2014 (JP) ................. 2014-069117

(51) Int. Cl.

| | | |
|---|---|---|
| *F21V 23/06* | (2006.01) | |
| *F21V 23/02* | (2006.01) | |
| *F21V 23/00* | (2015.01) | |
| *F21V 17/16* | (2006.01) | |
| *F21V 17/10* | (2006.01) | |
| *F21S 8/04* | (2006.01) | |
| *H01L 27/32* | (2006.01) | |
| *F21Y 115/20* | (2016.01) | |
| *F21Y 105/00* | (2016.01) | |

(52) U.S. Cl.
CPC ............ *F21V 17/164* (2013.01); *F21V 21/29* (2013.01); *F21V 23/003* (2013.01); *F21V 23/02* (2013.01); *F21V 23/06* (2013.01); *H01L 27/3293* (2013.01); *F21Y 2105/00* (2013.01); *F21Y 2115/20* (2016.08); *H01L 2251/5361* (2013.01)

(58) Field of Classification Search
CPC .. F21Y 2115/15; F21Y 2115/20; F21V 17/00; F21V 17/164; F21V 23/00; H05B 33/08; H05B 33/0803; H05B 33/0815; H01L 27/3297; H01L 27/3204
USPC ......... 362/147, 249.02, 249.03, 249.06, 362, 362/365; 315/169.3, 291, 307, 312
See application file for complete search history.

(56) References Cited

U.S. PATENT DOCUMENTS

| | | | |
|---|---|---|---|
| 8,801,213 B2 * | 8/2014 | Matsushima | .......... H05B 33/02 362/147 |
| 2009/0243514 A1 | 10/2009 | Oda et al. | |
| 2015/0034931 A1 * | 2/2015 | Matsuda | ............. H01L 27/3288 257/40 |
| 2016/0183388 A1 * | 6/2016 | Murakami | ............. G06F 1/189 361/679.21 |

FOREIGN PATENT DOCUMENTS

| | | |
|---|---|---|
| JP | 2009054426 A | 3/2009 |
| JP | 2009266804 A | 11/2009 |
| JP | 2012181942 A | 9/2012 |
| JP | 3179446 U | 11/2012 |
| JP | 2013037803 A | 2/2013 |
| JP | 2013051055 A | 3/2013 |
| WO | 2013114485 A1 | 8/2013 |
| WO | 2014001474 A1 | 1/2014 |

OTHER PUBLICATIONS

ISA Japan Patent Office, International Search Report Issued in Application No. PCT/JP2015/052959, Apr. 7, 2015, WIPO, 3 pages.

* cited by examiner

FIG. 5
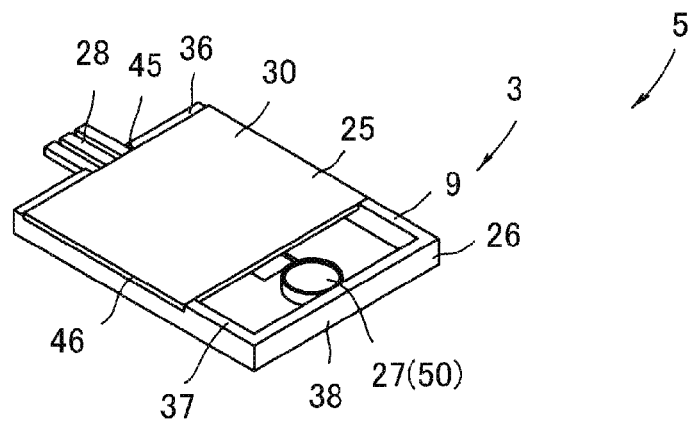
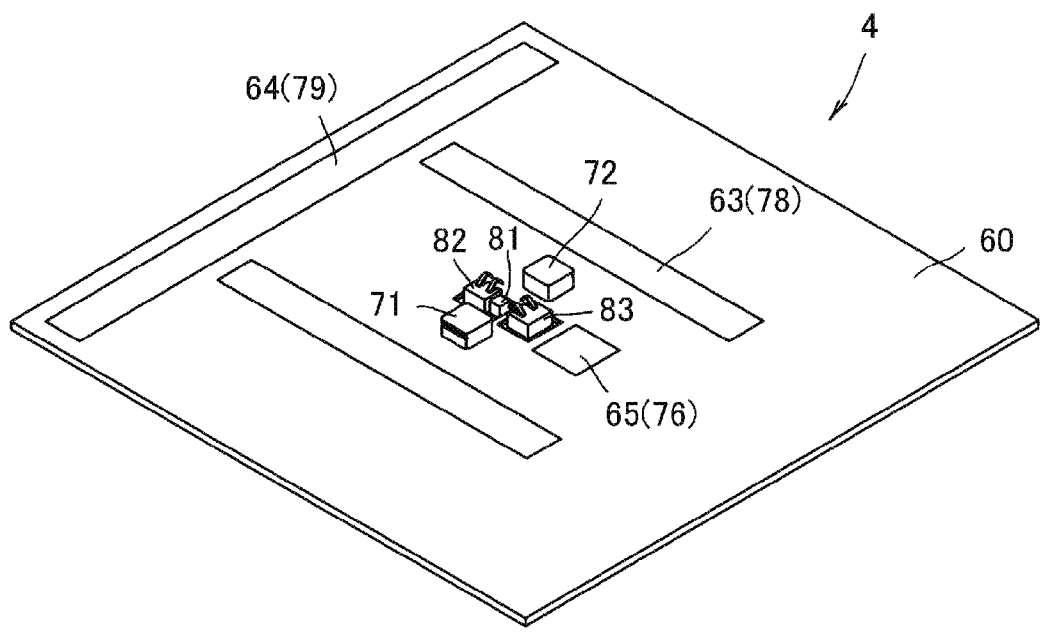

A-A SECTIONAL VIEW

B-B SECTIONAL VIEW

INTERSECTING ORIENTATION

PARALLEL ORIENTATION

FIG. 18
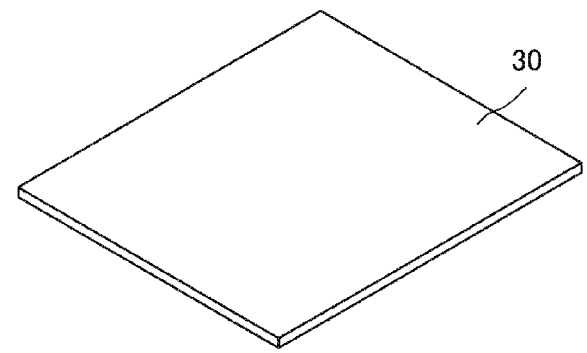
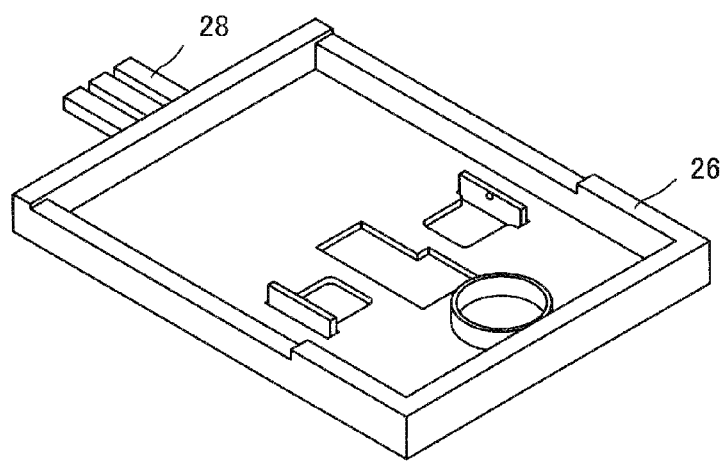
FIG. 19
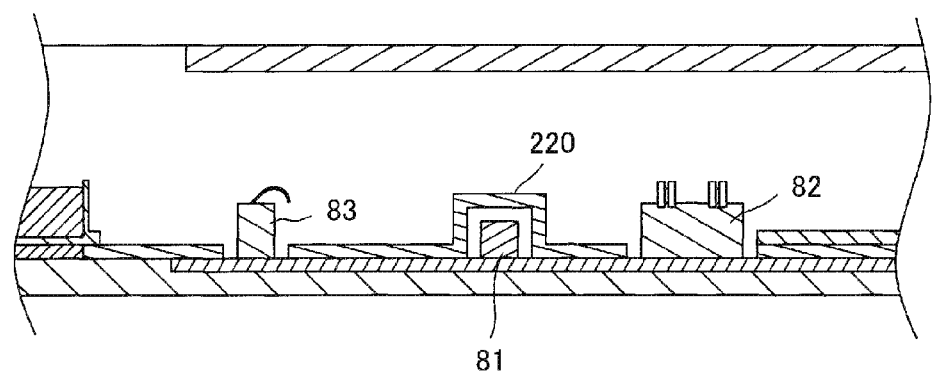

LIGHT EMISSION MODULE, CONNECTOR, AND MOUNTING STRUCTURE FOR LIGHT EMISSION MODULE

TECHNICAL FIELD

The present invention relates to a light-emitting module. In particular, the present invention relates to a light-emitting module that includes a built-in organic EL panel for lighting. The present invention also relates to a connector that constitutes a part of the light-emitting module. The present invention further relates to a light-emitting module attachment structure that attaches the light-emitting module to an installation target surface.

BACKGROUND ART

Recently, an organic EL module that includes a built-in organic EL panel has drew attention as a lighting device that takes the place of an incandescent lamp and a fluorescent lamp.

The organic EL panel generally includes a base material such as a glass substrate and an organic EL element laminated on the base material, and has a structure for sealing the organic EL element and a structure for supplying power to the organic EL element.

The organic EL element includes two electrodes, one or both of which have translucency and which face each other and a light-emitting layer which is made of an organic compound and laminated between the two electrodes. The organic EL panel emits light by energy of recombination between an electrically excited electron and a positive hole.

The organic EL module uses a surface-emitting organic EL panel and is a planar light source. Thus, a plurality of organic EL modules may be laid on an installation target surface such as a ceiling so as to be used as a single lighting.

However, since the organic EL panel uses the energy of recombination between an electron and a positive hole as described above, the light-emitting amount varies according to the amount of current passing through the electrodes. That is, in an organic EL panel, since the internal resistance varies according to the quality of electrodes and a light-emitting layer, the amount of current passing through electrodes varies, and the light-emitting amount varies. Thus, there may be individual differences in quality among organic EL panels, even when the organic EL panels are manufactured in the same manufacturing line.

The influence on light emission caused by the individual differences in electric resistance value is small. However, when dimming control is performed on an organic EL module, precise dimming control cannot be performed. Further, when a plurality of organic EL modules are laid in a plane shape and used, lightness difference may be generated between adjacent organic EL modules.

In view of an actual condition of development, a product is improved from day to day. Thus, there may be a difference in manufacturing method depending on manufacturing time even among products of the same model or between a product of a current model and a product of a successor model. Thus, a slight individual difference may be generated between new and old products.

Thus, a conventional organic EL panel has a structure that is provided with a control board including a semi-fixed resistor to absorb individual differences between products. That is, an attempt to adjust an electric resistance value by a semi-fixed resistor to adjust the amount of power supplied to an organic EL element to prevent individual differences in the internal resistance between products as far as possible has been taken.

In a lighting apparatus using such an organic EL panel, it is desired to improve workability when electrically connected to an external device and reduce restriction in arrangement caused by the connection.

Thus, for example, Patent Document 2 discloses an lighting device including a light source unit and a mounting unit attached to a non-light-emission surface of the light source unit, the mounting unit including a circuit board for lighting-controlling of the light source unit and a connection terminal to which a conductor for electrically interconnecting the circuit board and an external device is connected. In the lighting device, the connection terminal is arranged inwardly from an outer peripheral end of a surface of the mounting unit to which the light source unit is attached, and a clearance is formed between the light source unit and the mounting unit in a state that the mounting unit is attached to the light source unit. In Patent Document 2, the lighting device enables a space for housing the conductor to be ensured between the light source unit and the mounting unit. Thus, even if an additional space is needed when the lighting device is electrically connected to the external device, for example, by bending the external conductor according to the arrangement, it is possible to ensure the additional space and to enhance the workability. In addition, in the lighting device, it is also possible to eliminate the restriction in arrangement for ensuring a space for housing the conductor.

Further, Patent Document 3 discloses a method for controlling power supplied to a light-emitting element. In this method, in order to reduce variations in light output based on individual differences between light-emitting modules as described above, a semiconductor memory that stores the characteristics of each light-emitting element is provided in each light-emitting module, and power supplied to each light-emitting element is controlled according to the characteristics of the light-emitting element read from the semiconductor memory.

Patent Document 3 also describes a lighting apparatus including a power supply terminal that supplies power to a light-emitting element and an output terminal connected to the power supply terminal through a resistor element, the lighting device feedback-controlling the power supplied to the light-emitting element on the basis of output of the output terminal. In the lighting device, a part of the resistor element is formed of a thin film-like resistor on a substrate having the light-emitting element and a resistance value of the resistor is adjusted by trimming to enable previous adjustment of the resistance value of the resistor element according to individual differences.

PRIOR ART DOCUMENTS

Patent Documents

Patent Document 1: JP 2009-021035 A
Patent Document 2: JP 2013-051055 A
Patent Document 3: JP 2009-054426 A

DISCLOSURE OF INVENTION

Technical Problem

A control board that controls an organic EL panel is used also for control such as lighting control. In this case, a control circuit of the control board varies depending on a method of dimming control.

Conversely, when the same control method is used, the control board basically includes the same control circuit. Thus, there is a demand for the use of the same control board when similar control is performed in view of cost reduction.

However, when a different type of organic EL panel is used, an expected individual difference varies, and a range of a resistance to be adjusted varies. Thus, it is necessary to manufacture a control board for each type of organic EL panel. Thus, disadvantageously, the versatility of a mounted control board is low, and a control board that is formed corresponding to one type of organic EL panel cannot be used for another type of organic EL panel.

Thus, it is an object of the present invention to provide a light-emitting module capable of absorbing individual differences in organic EL panels that are inevitably generated in manufacture or individual differences between different types of organic EL panels. Further, it is an object of the present invention to provide a connector of an organic EL panel used in the light-emitting module. Furthermore, it is an object of the present invention to provide a light-emitting module attachment structure for attaching the light-emitting module to an installation target surface such as a ceiling.

Solution to Problem

The present inventor has made an attempt to separately provide a control board that performs dimming control and an adjustment element for absorbing individual differences to improve the versatility of the control board. That is, a part of an adjustment mechanism for absorbing individual differences in internal resistance is provided in the organic EL panel to enable reuse of the control board to reduce a manufacturing cost. The present inventor has considered that one type of control board can be used in a plurality of types of organic EL panels in this manner.

One aspect of the present invention derived under the above consideration is a light-emitting module including a light-emitting panel having an emission surface and a connector for connecting the light-emitting panel to a fixture fixed on an installation target surface, the connector including a connection side circuit that includes a circuit side power supply path contributory to power supply to the light-emitting panel, the light-emitting panel including an adjustment element capable of adjusting an adjustment factor according to characteristics of the light-emitting element and a light-emitting element, wherein the adjustment element is electrically connected to the light-emitting element through the circuit side power supply path.

The "installation target surface" described herein indicates an installation surface to be a target of installation of the light-emitting panel, specifically, a ceiling, a wall surface, a floor surface, or a crosspiece.

The "adjustment factor" described herein indicates a variable factor, that contributes to power supply to the light-emitting element, such as an electric resistance value, a voltage value, a current value, a power amount, or a heat amount.

According to this aspect, since the light-emitting module includes the adjustment element capable of adjusting the adjustment factor such as an electric resistance value according to the characteristics of the light-emitting element, it is possible to adjust individual differences generated among light-emitting panels during manufacture of the light-emitting panels by the adjustment element. Thus, it is possible to unify the light-emitting amount between light-emitting panels and to precisely perform control such as dimming control.

According to this aspect, since the adjustment element is provided in the light-emitting panel, it is possible to adjust the adjustment factor such as an electric resistance value using the adjustment element of the light-emitting panel. Accordingly, it is not necessary to provide an adjustment element for absorbing individual differences in the connector and not necessary to form the connector corresponding to the type of the light-emitting panel. Thus, according to this aspect, it is possible to use a connector that is formed corresponding to one light-emitting panel also in another light-emitting panel and to reduce the manufacturing cost.

In a preferred aspect, the adjustment element is capable of adjusting an electric resistance value of itself.

According to this aspect, the adjustment of the characteristics of the light-emitting panel can be easily performed.

In a preferred aspect, the connection side circuit further includes a supply side power supply path that contributes to power supply to the light-emitting panel and that is electrically connected in series to the circuit side power supply path through the adjustment element, and the adjustment element is electrically connected in series to the light-emitting element through the circuit side power supply path.

According to this aspect, since the light-emitting module includes the adjustment element capable of adjusting the adjustment factor such as an electric resistance value, it is possible to adjust individual differences generated between light-emitting panels during manufacture of the light-emitting panels by the adjustment element. Thus, it is possible to unify the light-emitting amount among light-emitting panels and to precisely perform control such as dimming control.

In this aspect, there is a path that starts from the supply side power supply path of the connector, passes through the adjustment element of the light-emitting panel, and returns to the circuit side power supply path of the connector. That is, it is possible to form a single circuit using the connection side circuit provided in the connector and the adjustment element of the light-emitting panel and to adjust the adjustment factor such as an electric resistance value by the adjustment element. Thus, it is not necessary to provide an adjustment element for absorbing individual differences in the connector and not necessary to form the connector corresponding to the type of the light-emitting panel. Thus, it is possible to use a connector that is formed corresponding to one light-emitting panel also in another light-emitting panel and to reduce the manufacturing cost.

In a more preferred aspect, the connection side circuit includes a bypass that bypasses the adjustment element and that connects the supply side power supply path with the circuit side power supply path, and the adjustment element constitutes a part of a current detection circuit that detects a current between the supply side power supply path and the circuit side power supply path.

In this aspect, the adjustment element is electrically connected in parallel to the bypass and constitutes a part of the current detection circuit. Thus, current between the supply side power supply path and the circuit side power supply path can be detected as voltage, and control and adjustment of the adjustment element can be easily performed.

In a preferred aspect, at least one of the supply side power supply path and the circuit side power supply path constitutes a stabilization circuit for making a current applied to the light-emitting element constant.

According to this aspect, stabilized current can be applied to the light-emitting element, and light emission of the light-emitting element is less prone to be affected by a noise or the like.

In a preferred aspect, at least one of the supply side power supply path or the circuit side power supply path constitutes a control circuit that controls an amount of power supplied to the light-emitting element in response to an external signal.

According to this aspect, dimming control for the light-emitting panel can be performed by transmitting a control signal such as a PWM control signal or an on/off control signal from the outside.

In a preferred aspect, the connector includes a circuit board, the circuit board including a plate-like or film-like connection side base material and the connection side circuit mounted thereon, a large part of the connection side circuit is mounted on one face of the connection side base material, and the circuit board is disposed in such a manner that the one face of the connection side base material faces the light-emitting panel.

"Mounting a large part of the connection side circuit" described herein indicates mounting equal to or more than four-fifths of principal devices except wiring. For example, when there are ten principal devices, equal to or more than eight principal devices should be mounted.

According to this aspect, the circuit board is disposed in such a manner that a surface mainly mounted (hereinbelow, also referred to as a mounting surface) of the connection side base material faces the light-emitting panel. In other words, a surface opposite to the mounting surface of the connection side base material (hereinbelow, also referred to as a non-mounting surface) is located on the outer side with respect to the light-emitting panel. That is, when the connector is viewed from the side having the non-mounting surface, a large part of the connection side circuit which contributes to power supply to the light-emitting panel is covered with the connection side base material. Thus, it is possible to prevent an operator from unexpectedly touching the connection side circuit and thereby prevent the occurrence of electric shock during an adjustment operation of the adjustment element. Thus, according to this aspect, for example, high safety can be ensured in the adjustment operation.

In the above definition, a state in which equal to or more than four-fifths of principal devices except wiring are mounted on one face of the connection side board is defined as a state in which "a large part of the connection side circuit is mounted" on one face of the connection side board. In view of more high safety, it is preferred that all the principal devices be mounted on one face of the connection side board.

For example, when the adjustment element is composed of a semi-fixed resistor capable of adjusting the electric resistance value by an external element, the thickness may be disadvantageously larger than the thickness when the adjustment element is composed of a fixed resistor.

Thus, in a preferred aspect based on the above problem, the connector includes a circuit board that mounts thereon the connection side circuit and a connector base that fixes the circuit board, the connector base including a housing recess or a housing through hole, and when the connector is attached to the light-emitting panel, a part of the adjustment element is housed inside the housing recess or the housing through hole.

According to this aspect, for example, even when a semi-fixed resistor is used as the adjustment element, since a part of the adjustment element is housed inside the housing recess or the housing through hole of the connector base, it is possible to reduce the bulkiness of the light-emitting module caused by the thickness of the adjustment element.

In another preferred aspect based on the above problem, the light-emitting panel includes a power supply board, the power supply board mounts thereon an adjustment element, the connector includes a circuit board that mounts thereon the connection side circuit and a connector base that fixes the circuit board, the connector base includes a connection side through hole, and when the connector is attached to the light-emitting panel, a part of the adjustment element is housed inside the control side through hole.

According to this aspect, even when a semi-fixed resistor is used as the adjustment element, it is possible to reduce the bulkiness of the light-emitting module caused by the thickness of the adjustment element similarly to the above aspect.

The control side through hole may be the same as the housing through hole.

In a preferred aspect, the light-emitting panel includes a power supply board, the power supply board mounting thereon a control terminal electrically connected to the adjustment element and a power supply terminal electrically connected to the light-emitting element; the connector includes a circuit board that mounts thereon the connection side circuit and a connector base that fixes the circuit board, the connector base having a control side through hole and a power supply side through hole; the control terminal is inserted into the control side through hole and physically connected to the connection side circuit; and the power supply terminal is inserted into the power supply side through hole and physically connected to the connection side circuit.

According to this aspect, since both of the control terminal and the power supply terminal are inserted into the respective through holes on the connector base and physically connected to the connection side circuit of the circuit board, it is possible to prevent an operator from touching the control terminal and the power supply terminal when the light-emitting module is assembled. Further, since the control terminal and the power supply terminal are partially or entirely inserted in the respective through holes, it is possible to reduce the bulkiness of the light-emitting module caused by the thickness of the control terminal and the power supply terminal.

In a preferred aspect, the control side through hole is partially connected to the housing through hole to form a single through hole.

In a preferred aspect, the light-emitting panel includes a panel body that includes the emission surface and a frame member that covers a face of the panel body opposite to the emission surface, the frame member including a projection that projects in a direction intersecting the emission surface the projection including a projecting side engagement part formed on a side face thereof; the connector includes a connector base, the connector base including a base body having a support hole and an engagement piece that is disposed in a standing manner with respect to the base body along an opening of the support hole and that includes a wall side engagement part formed on a side face thereof; and when the light-emitting panel is attached to the connector, the projection is inserted into the support hole to engage the projecting side engagement part with the wall side engagement part.

In this aspect, when the light-emitting panel is attached to the connector, the projection is inserted into the support hole to engage the projecting side engagement part and the wall side engagement part with each other. Thus, it is possible to integrate the light-emitting panel and the connector together by relatively moving either the light-emitting panel or the connector with respect to the other. That is, according to this aspect, it is possible to easily integrate the light-emitting panel and the connector together by a single moving operation.

In a more preferred aspect, the engagement piece is a thin plate and partially or entirely located inside the support hole, the engagement piece is supported on the base body so as to divide the support hole, and when the light-emitting panel is attached to the connector, the engagement piece is pressed by the projection and thereby elastically deformed, and the restoring force thereof acts toward the projection.

In this aspect, when the light-emitting panel is attached to the connector, the engagement piece of the connector base is pressed by the projection of the frame member and thereby elastically deformed, and the restoring force thereof acts toward the projection. Thus, the projecting side engagement part of the projection and the wall side engagement part of the engagement piece are biased in directions coming close to each other, which results in firmer engagement relationship therebetween. Thus, the connector and the light-emitting panel are less prone to be separated from each other, and have a high integration strength.

In a preferred aspect, the light-emitting panel includes a panel body including the emission surface and a frame member that covers a face of the panel body, the face being located opposite to the emission surface, the frame member includes at least two projections projecting in a direction intersecting the emission surface, the two projections include projecting side engagement parts formed on side faces thereof, the connector includes a connector base, the connector base includes a base body and at least two engagement pieces, the base body includes at least two support holes, each of the two engagement pieces is disposed corresponding to the corresponding one of the support holes and disposed in a standing manner with respect to the base body along an opening of the corresponding support hole, the two engagement pieces have a thin plate-like shape, face each other, include wall side engagement parts formed on faces facing each other, each of the two projections is inserted into the corresponding one of the support holes, and each of the projecting side engagement parts is engaged with the corresponding one of the wall side engagement parts.

According to this aspect, since each of the two projections is inserted in the corresponding one of the two support holes, the light-emitting panel is less prone to be displaced with respect to the connector in the in-plane direction of the emission surface.

Further, in this aspect, each of the engagement pieces includes the wall side engagement part formed on the face facing the other engagement piece, and the wall side engagement part is engaged with the projecting side engagement part formed on the side face of the projection. That is, the two engagement pieces are located on the inner side of the two engagement pieces, and the wall side engagement part and the projecting side engagement part are engaged with each other by the inner-outer positional relationship. That is, the light-emitting panel and the connector are fixed by holding the two projecting pieces by the two engagement pieces from the outer side. Thus, in an arrangement direction of the two projecting pieces, the light-emitting panel is less prone to be displaced with respect to the connector, and the light-emitting panel is less prone to be separated from the connector. Further, even when the light-emitting panel is attached to a ceiling, the light-emitting panel is locked by the engagement relationship between the wall side engagement parts and the projecting side engagement parts and thus does not fall.

In a more preferred aspect, the light-emitting panel includes a power supply board, the power supply board mounts thereon a control terminal electrically connected to the adjustment element and a power supply terminal electrically connected to the light-emitting element, the connector includes a circuit board that mounts thereon the connection side circuit and a connector base that fixes the circuit board, the connector base includes a control side through hole and a power supply side through hole, the control terminal is inserted into the control side through hole and physically connected to the connection side circuit, the power supply terminal is inserted into the power supply side through hole and physically connected to the connection side circuit, the projection, the control side through hole, and the power supply side through hole all fit within an installation region that has a shape similar to the light-emitting panel and centered on a center of the light-emitting panel and has half the area of the light-emitting panel in plan view of the light-emitting panel.

In this aspect, the projection, the control side through hole, and the power supply side through hole fit within the installation region having half the area of the light-emitting panel. Thus, it is possible to ensure minimum fixing of the light-emitting panel and power supply to the light-emitting panel without unnecessarily increasing the size of the connector base having the corresponding support hole. That is, it is possible to reduce the size of the connector base and to reduce the material cost of the connector base.

In a more preferred aspect, the light-emitting panel includes a panel body including the emission surface, a frame member that covers a face of the panel body, the face being located opposite to the emission surface, and a power supply board, the frame member includes at least two projections projecting in a direction intersecting the emission surface, the power supply board mounts thereon a control terminal electrically connected to the adjustment element and a power supply terminal electrically connected to the light-emitting element, the connector includes a circuit board that mounts thereon the connection side circuit and a connector base that fixes the circuit board, the connector base includes a control side through hole and a power supply side through hole, the control terminal is inserted into the control side through hole and physically connected to the connection side circuit, the power supply terminal is inserted into the power supply side through hole and physically connected to the connection side circuit, the connector base is formed of an insulator and a part of the connector base is interposed between the frame member and the circuit board, and the control side through hole and the power supply side through hole are located between the two projections.

In this aspect, the connection side through hole and the power supply side through hole are located between the two projections. Thus, even when the circuit board is pressed from the outside, the projections abut against the circuit board to support the circuit board, which enables damages of a device and a dimming control element mounted on the circuit board to be prevented.

In a preferred aspect, the light-emitting panel includes a panel body including the emission surface and a frame member that covers a face of the panel body, the face being located opposite to the emission surface, and the frame member includes a frame body formed of flexible resin and a reinforcement member that reinforces the stiffness of the frame body.

According to this aspect, since the frame body is formed of flexible resin, the frame body can be easily attached to the panel body. Further, the reinforcement member can reinforce the lack of stiffness as a frame caused by the flame body formed of flexible resin. Thus, according to this aspect, the light-emitting module is easily assembled and has a sufficient strength.

Further, according to this aspect, since the frame body is formed of flexible resin, it is possible to easily attach the panel body to the connector and to reduce the weight of the light-emitting panel.

In the above aspect, the frame body may include a reinforcement member housing part, the reinforcement member housing part may extend at least in one direction, and the reinforcement member may be housed in the reinforcement member housing part.

In a more preferred aspect, the frame member includes a plurality of the reinforcement members, the reinforcement members have a long plate-like shape, at least two of the reinforcement members are disposed parallel to each other, and a part of the adjustment element is located between the two reinforcement members.

According to this aspect, since the adjustment element is located between the two reinforcement members, it is possible to protect the adjustment element from an impact caused by, for example, falling.

In a more preferred aspect, the frame member includes a plurality of the reinforcement members, the reinforcement members have a plate-like shape, and at least two of the reinforcement members extend in directions intersecting each other when projected on the same plane.

In this aspect, the two reinforcement members extend in the directions intersecting each other when projected on the same plane. That is, the two reinforcement members reinforce two-direction components that are perpendicular to each other on the plane. Thus, the stiffness of the light-emitting panel against twist or the like is high, and the light-emitting panel is less prone to be damaged.

In a preferred aspect, the light-emitting panel is attachable to and detachable from the connector base.

According to this aspect, for example, when the light-emitting panel fails to function due to an initial failure or damage and requires repair, the repair can be performed by replacing the light-emitting panel with a new light-emitting panel and attaching the new light-emitting panel to the connector. That is, according to this aspect, it is possible to reuse the connector and reduce a repairing cost in the repair.

In a preferred aspect, the light-emitting panel includes a panel body including the emission surface and a frame member that covers a face of the panel body, the face being located opposite to the emission surface, the frame member includes a first attraction part, the connector includes a second attraction part, and the light-emitting panel is attached to the connector by a magnetic force generated between the first attraction part and the second attraction part.

According to this aspect, since the light-emitting panel is attached to the connector by the magnetic force generated between the first attraction part and the second attraction part, it is possible to easily integrate the light-emitting panel and the connector together by moving the light-emitting panel and the connector close to each other.

Further, according to this aspect, since the light-emitting panel and the connector are attracted to each other by the magnetic force generated between the first attraction part and the second attraction part, the light-emitting panel is less prone to fall off the connector even when the light-emitting panel is fixed to, for example, a ceiling.

In the above aspect, either the first attraction part or the second attraction part may be a magnet, and the other attraction part may be a ferromagnetic body.

In the above aspect, the connector base may include a base body, and the base body may be interposed between the first attraction part and the second attraction part.

According to this aspect, when the light-emitting panel is attached to or detached from the connector, the second attraction part is less prone to be detached from the connector base.

In a preferred aspect, the adjustment element is a semi-fixed resistor.

According to this aspect, it is possible to adjust the electric resistance value of the adjustment element itself by an external element such as a driver. That is, it is not necessary to separately provide a circuit or control for adjusting the electric resistance value like a fixed resistor, and adjustment can be easily performed corresponding to each light-emitting element.

In a preferred aspect, the light-emitting element is an organic EL element including two electrode layers and an organic light-emitting layer sandwiched between the two electrode layers.

According to this aspect, since the light-emitting panel is an organic EL panel, the light-emitting module can be made thin and light.

In the lighting device disclosed in Patent Document 2, a clearance is formed between the light source unit and the mounting unit. Thus, in the lighting device of Patent Document 2, a constructor or a user of the lighting device may touch an electric circuit or the like exposed in the clearance with a finger, which may cause a malfunction in the electric circuit. Further, in the lighting device of Patent Document 2, erroneous contact of a finger with power supplied from the outside may cause electric shock. Thus, the lighting device of Patent Document 2 has a problem in safety and reliability and has room for improvement.

Further, in the lighting device of Patent Document 2, the light source unit and the mounting unit are detachable from and attachable to each other by the engagement, and the engagement part therebetween and a coupling part of terminals for supplying power therebetween are located on the same plane when the light source unit and the mounting unit are engaged with and attached to each other. Thus, such a clearance in which the electric circuit is exposed to the outside is likely to be formed.

In view of this, the present inventor has made the following consideration to provide a light-emitting module that includes a light-emitting panel and a connector capable of detaching and attaching the light-emitting panel in which a circuit and a power supply terminal of the connector are not exposed to the outside when the light-emitting panel is detached from the connector.

Specifically, the present inventor has made an attempt to separately provide a mechanical engagement part between the light-emitting panel and the connector and an electrical coupling part therebetween on different planes to avoid contact of a finger with a circuit while maintaining a clearance for disposing wiring.

Specifically, the connector base and the circuit board constitute a part of the connector or the entire connector, and the light-emitting panel is detachable from and attachable to the connector. Further, the connector base has both a mechanical engagement function with the light-emitting panel and a circuit exposure preventing function on the face facing the light-emitting panel. Further, the circuit board has both an electrical coupling function with the light-emitting panel and a circuit exposure preventing function on the face facing the light-emitting panel. Accordingly, the present inventor has considered that it is possible to ensure a clearance for disposing a circuit that performs lighting control and a connection terminal to which a wire for electrical connection with an external device (hereinbelow, also merely referred to as the connection terminal) is connected and, at the same time, prevent the circuit from being exposed in the clearance, and prevent contact of a finger with the circuit.

One aspect of the present invention based on this consideration is a light-emitting module including a light-emitting panel including an emission surface and a connector for connecting the light-emitting panel to a fixture fixed to an installation target surface, the light-emitting panel being attachable to and detachable from the connector, wherein the light-emitting panel includes a light-emitting element and a power supply terminal electrically connected to the light-emitting element, the connector includes a circuit board, the circuit board including a plate-like or film-like connection side base material and a connection side circuit mounted on the connection side base material, and a connector base that fixes the circuit board, the connection side circuit contributes to power supply to the light-emitting panel, and a large part of the connection side circuit is mounted on one face of the connection side base material, at least a part of the connector base is formed of an insulator, and the part formed of the insulator includes a power supply side through hole, and when the light-emitting panel is attached to the connector, the one face of the connection side base material faces the light-emitting panel, and the part formed of the insulator is interposed between the light-emitting panel and the circuit board, and the power supply terminal is inserted into the power supply side through hole and physically connected to the connection side circuit.

Another aspect of the present invention based on this consideration is a light-emitting module including a light-emitting panel having an emission surface and a connector for connecting the light-emitting panel to a fixture fixed on an installation target surface, the light-emitting panel being attachable to and detachable from the connector, the light-emitting panel including a light-emitting element and a power supply terminal electrically connected to the light-emitting element, the connector including a circuit board that includes a plate-like or film-like connection side base material and a connection side circuit mounted on the connection side base material and a connector base that fixes the circuit board, wherein the connection side circuit contributes to power supply to the light-emitting panel, a large part of the connection side circuit being mounted on one face of the connection side base material, wherein at least a part of the connector base is formed of an insulator and includes a power supply side through hole, wherein when the light-emitting panel is attached to the connector, one face of the connection side base material faces the light-emitting panel, and the part formed of the insulator is interposed between the light-emitting panel and the circuit board and wherein the power supply terminal is inserted into the power supply side through hole and physically connected to the connection side circuit.

In manufacture of the light-emitting module, a connector capable of detaching and attaching the light-emitting panel with high versatility, high safety and low cost is required.

According to the above aspect, the light-emitting module includes the connector that is detachable from and attachable to the light-emitting panel, a clearance capable of disposing the connection terminal is ensured, and a circuit is not exposed so as to prevent contact of a finger. That is, in the above aspect, a mechanical engagement part between the light-emitting panel and the connector and an electrical coupling part therebetween are separately provided on different planes. Accordingly, it is possible to prevent contact of a finger with the circuit part while ensuring a clearance for circuit installation and external wiring. According to the above aspect, an electric shock possible part is not exposed even in a state in which the connector is detached.

In this manner, according to this aspect, the light-emitting module is provided with the connector, that is detachable from and attachable to the light-emitting panel, with high safety and low cost.

In a preferred aspect, the light-emitting panel includes a projection projecting in a direction intersecting the emission surface, the projection includes a projecting side engagement part formed on a side face thereof, the connector includes a connector base, the connector base includes a base body and an engagement piece, the base body includes a bottom face forming part constituting a bottom face of the base body, the bottom face forming part includes a power supply side through hole and a support hole, the engagement piece is disposed in a standing manner with respect to the base body along an opening of the support hole and includes a wall side engagement part formed on a side face thereof, and when the light-emitting panel is attached to the connector, the projection is inserted into the support hole to engage the projecting side engagement part with the wall side engagement part.

In a preferred aspect, the light-emitting panel includes a projection projecting in a direction intersecting the emission surface, the projection includes a projecting side engagement part formed on a side face thereof, the connector base includes a base body, the base body including the power supply side through hole and a bottom face forming part including a support hole, and an engagement piece disposed in a standing manner with respect to the base body along an opening of the support hole, the engagement piece includes a wall side engagement part formed on a side face thereof, and when the light-emitting panel is attached to the connector, the projection is inserted into the support hole to engage the projecting side engagement part with the wall side engagement part.

According to the above aspect, the reliability in attachment/detachment of the light-emitting panel with respect to the connector base is improved.

In a preferred aspect, the connector includes a circuit board, the base body has a dish-like shape and includes a side face forming part rising from the bottom face forming part, a part of the side face forming part in the rising direction is cutout to form a step, and the circuit board is fixed to the step.

That is, in the above aspect, preferably, the base body is a dish-like member and includes the bottom face forming part and a side face forming part rising from the bottom face forming part, and a step shape formed by cutting away a part of the side face forming part in the rising direction is formed on the side face forming part so as to form a recess capable of fixing the circuit board.

According to this aspect, the existence of the base body enables a shielding function for the circuit and the like to be improved and the thickness of the light-emitting module to be reduced. According to this aspect, it is possible to improve the mechanical strength of the connector and also improve the mechanical strength of the entire light-emitting module.

In a preferred aspect, the distance between the one face of the connection side board and the bottom face forming part is 0.5 mm or more and 15 mm or less.

With this range, it is possible to prevent a finger from being mistakenly inserted while forming a clearance for disposing wiring between the connection side board and the bottom face forming part.

In a preferred aspect, the distance between the connection side board and the bottom face forming part is 10 mm or less, and 5 mm or less in a more preferred aspect.

In a preferred aspect, the distance between the connection side board and the bottom face forming part is 1 mm or more, and 2 mm or more in a more preferred aspect.

In the lighting device disclosed in Patent Document 2, an engagement part of the light source unit is inserted into an engaged part on one end of the mounting part with the light source unit tilted, and the light source unit is then turned around the engaging part therebetween. In this manner, a terminal part on the other end of the light source unit and the engagement part are engaged with and coupled to a terminal groove and the engaged part of the mounting part. Further, the mounting part is previously fixed to a mounting target. Thus, the thickness of the entire lighting device is substantially determined by the thickness of the mounting part. Therefore, the lighting device has a problem that the characteristics of an organic EL light-emitting panel such as plane-shape, thinness, and lightness cannot be sufficiently exhibited, thus having room for improvement.

Thus, the present inventor has made the following consideration to provide a light-emitting module having a connector that connects an organic EL light-emitting panel to a fixture fixed to an installation target surface, the light-emitting module making the most of the characteristics of the organic EL light-emitting panel such as being small and light, and having high reliability.

Specifically, the present inventor has made an attempt to detachably and attachably assemble the organic EL light-emitting panel and the connector, and provide a projection for fitting and a power supply terminal for power supply both projecting outward from the center or the vicinity of the center of the organic EL light-emitting panel so as to be connected to the connector. That is, the projection for fitting protects the power supply terminal projecting from the light-emitting panel, and the projection and the power supply terminal are provided in a limited range near the center of the light-emitting panel. Further, a fitting part for connection that projects toward an external power source and is fitted with the projection for fitting of the light-emitting panel is provided in the connector. Accordingly, it is possible to provide a connector that is small and light and has high reliability, high safety and high versatility and to provide a light-emitting module that is less prone to lose the characteristics of the organic EL light-emitting panel.

One aspect of the present invention based on this consideration is a light-emitting module including a light-emitting panel and a connector for connecting the light-emitting panel to a fixture fixed on an installation target surface, the light-emitting panel including a panel body including an emission surface and a light-emitting element having at least an organic light-emitting layer, a power supply board mounting thereon a power supply terminal electrically connected to the light-emitting element, and a frame member including a frame body that covers a face of the panel body opposite to the emission surface, the frame body including at least two projections projecting in a direction intersecting the emission surface, the two projections including projecting side engagement parts formed on side faces thereof, the connector including a circuit board that mounts thereon a connection side circuit, and a connector base that fixes the circuit board and that includes a base body and at least two engagement pieces, the base body including a power supply side through hole and at least two support holes, each of the two engagement pieces being disposed to corresponding one of the two support holes and being disposed in a standing manner with respect to the base body along an opening of the corresponding support hole, the two engagement pieces having a thin plate-like shape, facing each other, and including wall side engagement parts formed within faces thereof, wherein the two projections and the power supply side through hole all fit within an installation region that has a shape similar to the light-emitting panel and centered on a center of the light-emitting panel and has half the area of the light-emitting panel in plan view of the light-emitting panel, wherein the light-emitting panel being attachable to and detachable from the connector base, wherein when the light-emitting panel is attached to the connector, each of the two projections is inserted into the corresponding one of the support holes, and each of the projecting side engagement parts is engaged with the corresponding one of the wall side engagement parts, and wherein the power supply terminal is located between the two projections, and inserted into the power supply side through hole and physically connected to the connection side circuit.

Another aspect of the present invention based on this consideration is a light-emitting module including a light-emitting panel including an emission surface and a connector for connecting the light-emitting panel to a fixture fixed to an installation target surface, wherein the light-emitting panel includes a panel body including the emission surface, a power supply board, and a frame member that covers a face of the panel body, the face being located opposite to the emission surface, the light-emitting panel body includes a light-emitting element, the light-emitting element is an organic EL element including at least two electrode layers and an organic light-emitting layer sandwiched between the two electrode layers, the power supply board mounts thereon a power supply terminal electrically connected to the light-emitting element, the frame member includes a frame body formed of resin, the frame body includes at least two projections projecting in a direction intersecting the emission surface, the two projections include projecting side engagement parts formed on side faces thereof, the connector includes a connector base and a circuit board that mounts thereon a connection side circuit, the connector base fixes the circuit board and includes a base body and at least two engagement pieces, the base body includes a power supply side through hole and at least two support holes, each of the two engagement pieces is disposed corresponding to the corresponding one of the two support holes and disposed in a standing manner with respect to the base body along an opening of the corresponding support hole, the two engagement pieces have a thin plate-like shape, face each other, include wall side engagement parts formed within faces thereof, the two projections and the power supply side through hole all fit within an installation region that has a shape similar to the light-emitting panel and centered on a center of the light-emitting panel and has half the area of the light-emitting panel in plan view of the light-emitting panel, and when the light-emitting panel is attached to the connector, each of the two projections is inserted into the corresponding one of the support holes, and each of the projecting side engagement parts is engaged with the corresponding one of the wall side engagement parts, and the power supply terminal is inserted into the power supply side through hole and physically connected to the connection side circuit so that the light-emitting panel is attachable to and detachable from the connector base, and the power supply terminal is located between the two projections.

According to this aspect, it is possible to provide a light-emitting module that includes the connector, makes the most of the characteristics of the organic EL light-emitting panel, is small and light, and has high reliability.

In a preferred aspect, the connector fits within the installation region that has a shape similar to the light-emitting panel and centered on a center of the light-emitting panel and has half the area of the light-emitting panel in plan view of the light-emitting panel.

In a more preferred aspect, the installation region has quarter the area of the light-emitting panel, and has one-eighth the area of the light-emitting panel in a further more preferred aspect.

In a preferred aspect, the frame member includes at least two reinforcement members that reinforce the stiffness of the frame body, the two reinforcement members have a long plate-like shape and are separated from each other so as to be parallel to each other in plan view, and the installation region is located between the two reinforcement members.

That is, preferably, the frame member includes a plurality of reinforcement members that reinforce the stiffness of the frame body, at least two of the reinforcement members are long plate-like reinforcement members that are disposed parallel to each other and separated from each other, and the installation region is located between the two long plate-like reinforcement members.

According to this aspect, since the power supply terminal in the installation region is surrounded by the connector and the frame member, in particular, the projection, and located between the two reinforcement members, it is possible to protect the adjustment element from an impact caused by, for example, falling and to impart a sufficient mechanical strength to the entire module.

In a preferred aspect, the light-emitting panel includes a panel body including an emission surface, a power supply board, and a frame member that covers a face of the panel body, the face being located opposite to the emission surface, the connector includes a circuit board and a connector base that fixes the circuit board, at least a part of the connector base is formed of an insulator, and the part formed of the insulator is interposed between the frame member and the circuit board.

In a preferred aspect, the connector base is formed of an insulator and a part of the connector base is interposed between the frame member and the circuit board.

In a more preferred aspect, the connector base includes an adjustment element housing recess or through hole within the face facing the light-emitting panel, and a part of the adjustment element is housed inside the adjustment element housing recess or through hole.

According to this aspect, for example, even when a semi-fixed resistor is used as the adjustment element, since a part of the adjustment element is housed inside the adjustment element housing recess or through hole of the connector base, it is possible to reduce the bulkiness of the light-emitting module caused by the thickness of the adjustment element.

In the method disclosed in Patent Document 3, for example, when a semiconductor memory that stores the characteristics of the light-emitting element is used, in order to turn on the light-emitting module, it is necessary not only to store the characteristics of the light-emitting element in the semiconductor memory, but also to provide a dedicated lighting device that is capable of reading the characteristics and controlling power to be supplied according to the read characteristics. Thus, the configuration of the lighting device becomes disadvantageously complicated.

When a method of trimming a thin film-like resistor on a substrate having the light-emitting element formed thereon is used, it is necessary to seal the light-emitting element and the resistor and perform framing thereon after the trimming of the resistor to stabilize the characteristics. Thus, a change in the characteristics or failure may occur in these steps, and there is room for further improvement.

Thus, the present inventor has made the following consideration to provide a light-emitting module provided with a connector that connects an organic EL light-emitting panel to a fixture on an installation target surface, the light-emitting module satisfying the following two points (1) and (2). Specifically, (1) an adjustment element for feedback-controlling power to be supplied can be adjusted according to the characteristics of a light-emitting element in a state in which a frame member of the panel is attached through a sealing step, and (2) a power supply terminal electrically connected to the light-emitting element and a control terminal electrically connected to the adjustment element are exposed to the outside in a state in which a connector base of the connector is attached to the light-emitting panel.

That is, the present inventor has made the following attempt. An adjustment element, a control terminal electrically connected to the adjustment element, and a power supply terminal are mounted as a part of a power supply board. Then, the adjustment element is made adjustable in a state in which the power supply board is mounted on a face of a panel body which is a principal part of a light-emitting panel, the face being located opposite to an emission surface, and a frame member is attached. Further, the power supply terminal is made electrically connectable to the light-emitting element of the panel body by attaching the frame member.

Specifically, the adjustment element and the control terminal which are parts relating to adjustment are independently provided as a part of the power supply board. The adjustment element enables an adjustment factor to be adjusted according to the characteristics of the light-emitting element on the light-emitting panel. Further, the control terminal is made physically and mechanically connectable to a connection side circuit which is a part of the connector by attaching the connector to the light-emitting panel. The prevent inventor has considered that it is possible to provide a light-emitting module that is capable of absorbing characteristic differences among products or types of product, and has high reliability and high productivity by separately providing the adjustment element and the control terminal in this manner. Further, the prevent inventor has considered that it is possible to provide a light-emitting module that is capable of recording the light-emitting element characteristics in a state of a finished product as a light-emitting module and capable of preventing electric shock by a voltage applying part which forms a projection with respect to an external power supply side during power supply.

One aspect of the present invention based on this consideration is a light-emitting module including a light-emitting panel and a connector for connecting the light-emitting panel to a fixture fixed on an installation target surface, the light-emitting panel including a panel body that includes an emission surface and a light-emitting element; a power supply board that mounts thereon an adjustment element capable of adjusting an adjustment factor according to characteristics of the light-emitting element, a control terminal electrically connected to the adjustment element, and a power supply terminal electrically connected to the light-emitting element; and a frame member that covers a face of the panel body opposite to the emission surface and that includes an insertion hole, the connector including a circuit board and a connector base that fixes the circuit board and that includes a control side through hole and a power supply side through hole, wherein the adjustment element is exposed to the outside so as to be adjustable in a state in which the connector is detached from the light-emitting panel, and wherein when the connector base is attached to the light-emitting panel, the control terminal is inserted into the insertion hole and the control side through hole and exposed to the outside, and the power supply terminal is inserted into the insertion hole and the power supply side through hole and exposed to the outside.

Another aspect of the present invention based on this consideration is a light-emitting module including a light-emitting panel including an emission surface and a connector for connecting the light-emitting panel to a fixture fixed to an installation target surface, wherein the light-emitting panel includes a power supply board that mounts thereon an adjustment element, a light-emitting element, a panel body including the emission surface, and a frame member that covers a face of the panel body, the face being located opposite to the emission surface, the adjustment element is adjustable according to characteristics of the light-emitting element, the power supply board further mounts thereon a control terminal electrically connected to the adjustment element and a power supply terminal electrically connected to the light-emitting element, the frame member includes an insertion hole, the connector includes a circuit board that mounts thereon a connection side circuit and a connector base that fixes the circuit board, the connector base includes a control side through hole, a power supply side through hole and an adjustment element housing recess or through hole, the adjustment element is exposed so as to be adjustable in a state in which the connector is detached from the light-emitting panel, and the control terminal is exposed through the insertion hole and the control side through hole so as to be physically connectable to the connection side circuit and the power supply terminal is exposed through the insertion hole and the power supply side through hole so as to be physically connectable to the connection side circuit in a state in which the connector base is attached to the light-emitting panel.

According to the above aspect, the adjustment element can be adjusted in a state in which the frame member is attached to the panel body. Further, the power supply terminal and the control terminal can be exposed to the outside in a state in which the connector base of the connector is attached to the light-emitting panel. Thus, terminals can be easily connected to the power supply terminal and the control terminal, and power supply to the light-emitting element from the outside through the adjustment element can be easily performed when the light-emitting module is assembled.

In a preferred aspect, the adjustment element housing recess or through hole is present within the face of the connector base, the face facing the light-emitting panel. In a more preferred aspect, a part of the adjustment element is housed inside the adjustment element housing recess or through hole.

In a preferred aspect, the adjustment element is covered with the adjustment element housing recess so as not to be adjusted in a state in which the connector base is attached to the light-emitting panel.

In a preferred aspect, the light-emitting panel includes an adjustment element, the adjustment element is capable of adjusting an adjustment factor according to the characteristics of the light-emitting element, the connector includes a connector base, the connector base includes a housing recess capable of housing the adjustment element, and the adjustment element is covered with the housing recess so as not to be adjusted in a state in which the connector base is attached to the light-emitting panel.

According to this aspect, the adjustment element, for example, a semi-fixed resistor is covered with the connector base and kept out of view. Thus, even when the connector attached to the light-emitting panel is mistakenly separated into the connector base and the circuit board, it is possible to prevent unintentional change of information of the adjustment element which is a record of the characteristics of the light-emitting element belonging to the light-emitting panel, for example, a resistance value as an adjustment value. Correction as rewrite of the information is performed with the connector detached from the light-emitting panel on the basis of recognition as correction with respect to the light-emitting panel.

In a preferred aspect, the connection side circuit includes a circuit side power supply path that contributes to power supply to the light-emitting panel, and the adjustment element is electrically connected to the light-emitting element through the circuit side power supply path.

According to this aspect, characteristic information of the light-emitting element belonging to the panel body can be extracted to the outside of the panel body irrelevantly to the panel body when power supply is not performed.

One aspect of the present invention is a connector capable of connecting a light-emitting panel having an emission surface, to a fixture fixed on an installation target surface, the connector being connectable to the light-emitting panel, the light-emitting panel including a light-emitting element and an adjustment element capable of adjusting an adjustment factor according to characteristics of the light-emitting element, the connector including a circuit side power supply path that contributes to power supply to the light-emitting panel, wherein when the connector is connected to the light-emitting panel, the adjustment element is electrically connected to the light-emitting element through the circuit side power supply path.

According to this aspect, the connector is used for the light-emitting panel provided with the adjustment element that absorbs individual differences. Thus, since the connector is not required to include an adjustment element incorporated therein, the connector can be used for various light-emitting panels. For example, even when a connector is formed corresponding to one light-emitting panel, the connector can be used also in another light-emitting panel that performs the same control.

One aspect of the present invention is a connector capable of connecting a light-emitting panel, the light-emitting panel including an emission surface, to a fixture fixed to an installation target surface, the connector being capable of attaching and detaching the light-emitting panel, wherein the light-emitting panel includes a light-emitting element including at least an organic light-emitting layer, a power supply board, and at least two projections, the two projections project in a direction intersecting the emission surface and include projecting side engagement parts formed on side faces thereof, the power supply board of the light-emitting panel mounts thereon a power supply terminal electrically connected to the light-emitting element, the light-emitting panel further includes a connector base and a circuit board that mounts thereon a connection side circuit, the connector base includes a base body that fixes the circuit board and at least two engagement pieces, the base body includes a power supply side through hole and at least two support holes, each of the two engagement pieces is disposed in a standing manner with respect to the base body along an opening of the corresponding one of the support holes, the two engagement pieces have a plate-like shape, face each other, and include wall side engagement parts formed on faces thereof, and, in plan view of a state with the light-emitting panel attached, both the two projections fit within an installation region that has a shape similar to the light-emitting panel and centered on a center of the light-emitting panel and has half the area of the light-emitting panel, each of the two projections is inserted into the corresponding one of the two support holes, each of the projecting side engagement parts of the light-emitting panel is engaged with the corresponding one of the wall side engagement parts of the engagement pieces, and the power supply terminal is inserted into the power supply side through hole so that the connection side circuit is physically connected to the power supply terminal, and the entire fits within the installation region.

One aspect of the present invention is a connector capable of connecting a light-emitting panel, the light-emitting panel including an emission surface, to a fixture fixed to an installation target surface, wherein the light-emitting panel includes a light-emitting element and at least two projections projecting in a direction intersecting the emission surface, the light-emitting element is an organic EL element including two electrode layers and an organic light-emitting layer sandwiched between the two electrode layers, the two projections include projecting side engagement parts formed on side faces thereof, the connector includes a connector base and a circuit board that mounts thereon a connection side circuit, the connector base fixes the circuit board and includes a base body and at least two engagement pieces, the base body includes a power supply side through hole and at least two support holes, each of the two engagement pieces is disposed corresponding to the corresponding one of the support holes and disposed in a standing manner with respect to the base body along an opening of the corresponding support hole, the two engagement pieces have a plate-like shape, face each other, and include wall side engagement parts formed on faces thereof, the two projections and the power supply side through hole all fit within an installation region that has a shape similar to the light-emitting panel and centered on a center of the light-emitting panel and has half the area of the light-emitting panel in plan view of the light-emitting panel, and when the light-emitting panel is attached to the connector, each of the projections is inserted into the corresponding one of the support holes, each of the projecting side engagement parts is engaged with the corresponding one of the wall side engagement parts, and the power supply terminal is inserted into the power supply side through hole and physically connected to the connection side circuit so that the light-emitting panel is detachable from and attachable to the connector base and the connector fits within the installation region in plan view of the light-emitting panel.

According to the above aspect, the connector is small and light and has high reliability while making the most of the characteristics of the organic EL light-emitting panel.

In a preferred aspect, the connector includes a connection fitting part projecting toward an external power source.

According to this aspect, it is possible to reduce the risk of electric shock caused by power supply from the external power source.

One aspect of the present invention is a light-emitting module attachment structure including the light-emitting module according to the above aspect and the fixture, wherein the light-emitting panel is detachably fixed by the connector, wherein the connector includes a connection fitting part, wherein the fixture is integrally fixed to the installation target surface and includes a fixing side fitting part, and wherein the fixing side fitting part and the connection fitting part are detachably fitted with each other.

According to this aspect, since the fixing side fitting part and the connection fitting part are detachably fitted with each other, a used light-emitting module can be replaced with a new light-emitting module to be used. For example, when a light-emitting panel provided with an adjustment element is used, individual differences among products in replacement can be absorbed by the adjustment element. Thus, it is possible to allow the light-emitting panel to emit light with high reproducibility.

In a preferred aspect, the connection fitting part projects toward the external power source.

According to this aspect, it is possible to reduce the risk of electric shock caused by power supply from the external power source.

An aspect relating to the present invention is a light-emitting module including a light-emitting panel including an emission surface and a connector for connecting the light-emitting panel to a fixture fixed to an installation target surface, wherein the connector includes a circuit board that contributes to power supply to the light-emitting panel and a connector base that supports the circuit board, the circuit board includes a power supply part electrically connectable to an external power source, the connector base includes a connection side through hole, the light-emitting panel includes an adjustment element and a light-emitting element, the adjustment element forms a part of a power supply path from the power supply part to the light-emitting element and is capable of adjusting the amount of power supplied to the light-emitting element, and when the light-emitting panel is attached to the connector, the connector base is mounted on the light-emitting panel, and the adjustment element is inserted into the connection side through hole of the connector base and connected to the circuit board.

According to this aspect, since a part of the adjustment element is housed inside the connection side through hole of the connector base, it is possible to ensure an installation space for the adjustment element by the thickness of the connector base and to reduce the bulkiness caused by the adjustment element.

An aspect relating to the present invention is a light-emitting module attachment structure including a light-emitting panel including an emission surface, a fixture fixed to an installation target surface, and a connector for connecting the light-emitting panel to the fixture, wherein the fixture includes a fixing side signal output part capable of outputting a control signal, the connector includes a control board that controls the amount of power supplied to the light-emitting panel, the connector is detachably attached to the fixture, the light-emitting panel is detachably attached to the connector, and the control board inputs a control signal output from the fixing side signal output part to adjust the amount of power supplied to the light-emitting panel.

According to the configuration of this aspect, the three members, specifically, the light-emitting panel, the connector, and the fixture are attachable to and detachable from each other, and the three members control the light-emitting panel in cooperation with each other. According to this configuration, for example, when the light-emitting panel is broken, the broken light-emitting panel can be replaced with a new light-emitting panel to be used. Further, a method for controlling the light-emitting panel can be changed by replacing the connector. Further, a method for fixing the fixture to the installation target surface can be changed by changing the fixture.

In this manner, according to this aspect, it is possible to meet various needs by disassembling the components and replacing each component.

Effect of Invention

According to the light-emitting module of the present invention, it is possible to absorb individual differences in organic EL panels that are inevitably generated in manufacture or individual differences among different types of organic EL panels.

According to the connector of the present invention, it is possible to perform control such as dimming control even in different organic EL panels.

According to the light-emitting module attachment structure of the present invention, it is possible to easily attach the organic EL module to the installation target surface.

BRIEF DESCRIPTION OF DRAWINGS

FIG. 5 is an explanatory diagram of the light-emitting module of FIG. 3, specifically, an exploded perspective view in which a light-emitting panel is detached from a connector.

FIGS. 15A to 15C are explanatory diagrams of the attachment process of the light-emitting module of FIG. 1, wherein FIG. 15A is a sectional view illustrating a state before the light-emitting panel is attached to the connector base, FIG. 15B is a sectional view illustrating a state in the middle of the attachment of the light-emitting panel to the connector base, and FIG. 15C is a sectional view illustrating a state after the light-emitting panel is attached to the connector base.

FIGS. 17A and 17B are explanatory diagrams of the attachment process of the light-emitting module of FIG. 1, wherein FIG. 17A is a side view illustrating a state in which the light-emitting module is attached in an intersecting orientation and FIG. 17B is a side view illustrating a state in which the light-emitting module is brought into a parallel orientation from the state of FIG. 17A.

FIG. 18 is an exploded perspective view of a connector of another embodiment of the present invention.

FIG. 19 is a sectional view of a light-emitting module in another embodiment of the present invention.

BEST MODE FOR CARRYING OUT THE INVENTION

The present invention mainly relates to a light-emitting module attachment structure 1 used as a lighting device. Hereinbelow, up, down, right and left positional relationships will be described based on an orientation in FIG. 2 unless otherwise specifically noted. That is, a light extraction side of a light-emitting module 5 during lighting corresponds to the lower side. Physical properties described below indicate physical properties in a normal state unless otherwise specifically noted. Each drawing may be exaggerated as a whole compared to its actual size (length, width, or thickness) to facilitate understanding.

Figure 1:
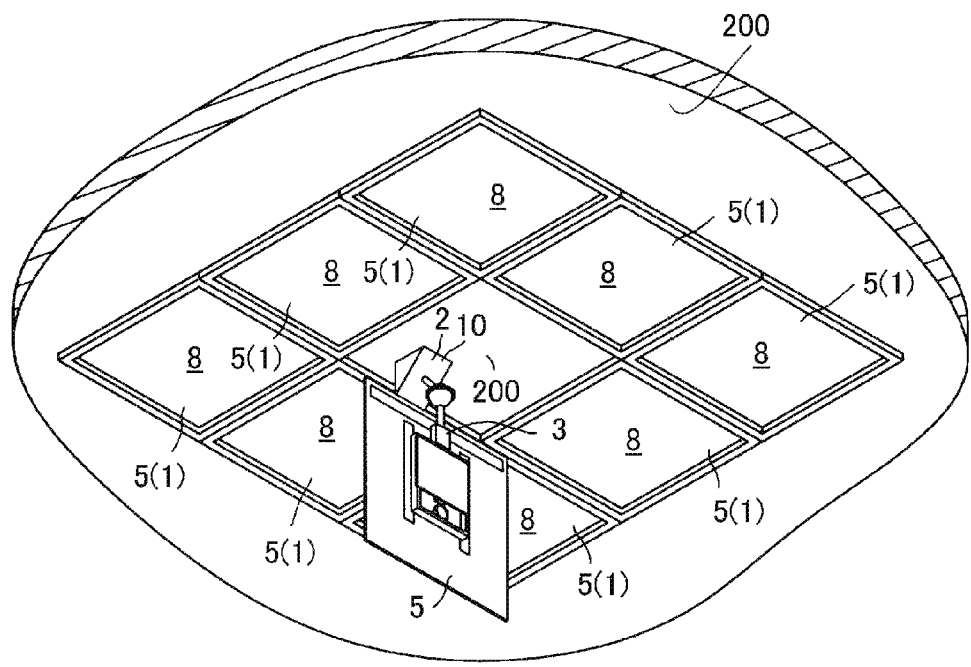
FIG. 1 is an explanatory diagram illustrating a usage condition of a light-emitting module attachment structure according to a first embodiment of the present invention, specifically, a perspective view in which the orientation of one light-emitting module is changed.

As illustrated in FIG. 1, the light-emitting module attachment structure 1 of a first embodiment of the present invention attaches the light-emitting module 5 to an installation target surface 200 such as a ceiling or a wall together with a plurality of light-emitting modules 5 so as to be arranged side by side.

Figure 2:
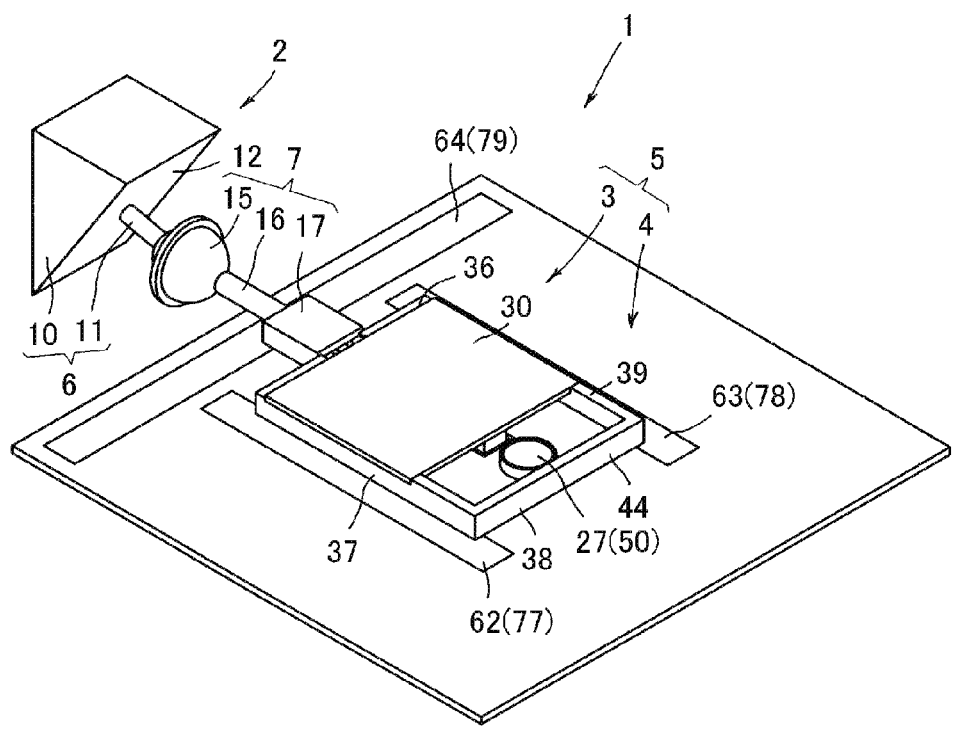
FIG. 2 is a perspective view of a principal part of the light-emitting module attachment structure of FIG. 1.

As illustrated in FIG. 2, the light-emitting module attachment structure 1 includes a fixture 2 and the light-emitting module 5.

As illustrated in FIG. 1, the fixture 2 is a member that is integrally fixed to the installation target surface 200 and attaches a connector 3 to the installation target surface 200.

Figure 4:
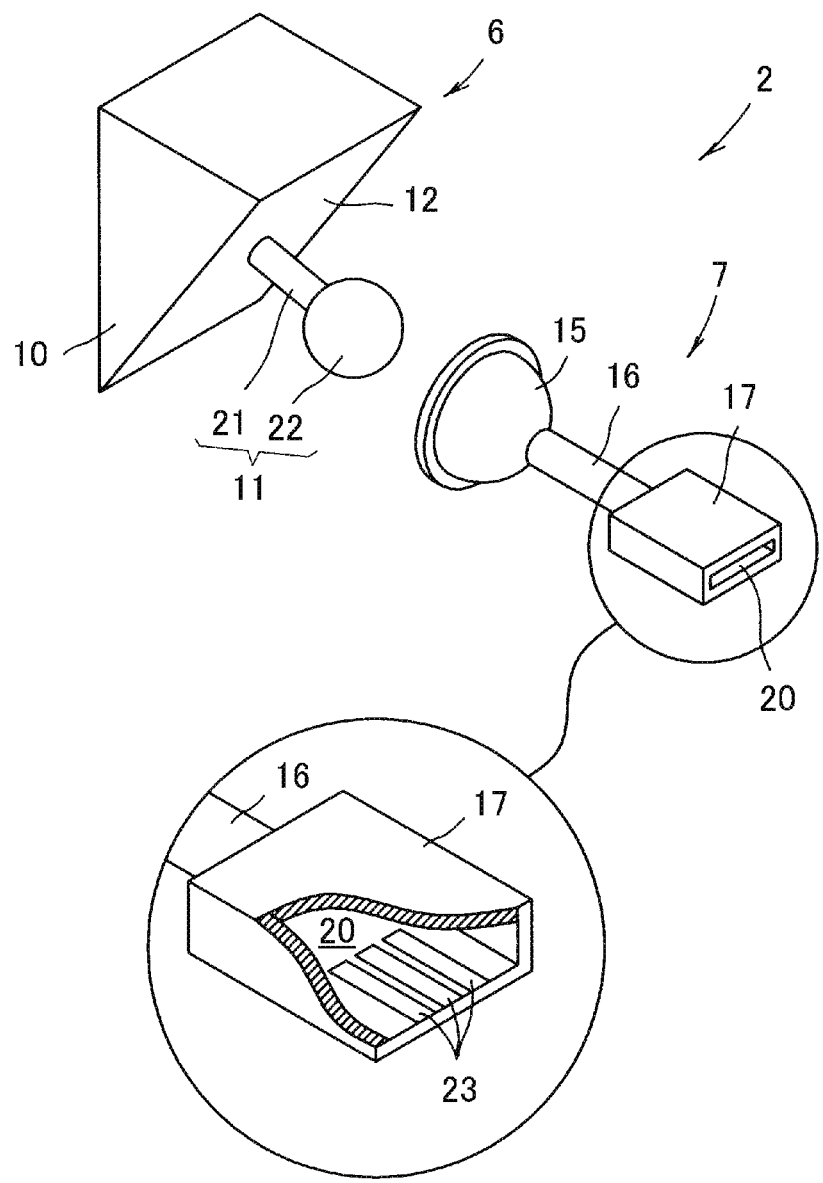
FIG. 4 is an explanatory diagram of the fixture of FIG. 3, specifically, an exploded perspective view in which a fixing side fitting part is detached from a support part.

As illustrated in FIG. 4, the fixture 2 includes a support part 6 and a fixing side fitting part 7.

As illustrated in FIG. 4, the support part 6 includes a connection part 10 and a coupling part 11.

As can be seen from FIGS. 1 and 2, the connection part 10 connects the installation target surface 200 and the coupling part 11 to each other.

The connection part 10 is a triangular prism-shaped part having a right-angled triangular cross section, and has an orientation with the triangular prism inclined in the horizontal direction. That is, as can be seen from FIGS. 1 and 4, an inclined surface 12 of the connection part 10 faces downward in a direction that intersects the installation target surface 200.

As illustrated in FIG. 4, the coupling part 11 includes a shaft part 21 and a ball part 22.

The shaft part 21 is a cylindrical part that projects in a perpendicular direction from the inclined surface 12 of the connection part 10. The ball part 22 is connected to the shaft part 21 at a projecting direction end from the inclined surface 12.

The ball part 22 is a substantially spherical part that is engageable with a ball receiving part 15 of the fixing side fitting part 7 (described below). The ball part 22 is housed inside the ball receiving part 15 of the fixing side fitting part 7 to function as a ball joint. That is, the ball part 22 constitutes a universal joint and serves as a turning center of the light-emitting module 5 when the attachment structure 1 is assembled.

As illustrated in FIG. 4, the fixing side fitting part 7 includes the ball receiving part 15, a fitting side shaft part 16, and a fitted part 17.

The ball receiving part 15 is paired with the ball part 22 of the coupling part 11 and includes a housing space which is capable of partially or entirely housing the ball part 22. The ball receiving part 15 has a concave spherical inner surface.

Figure 3:
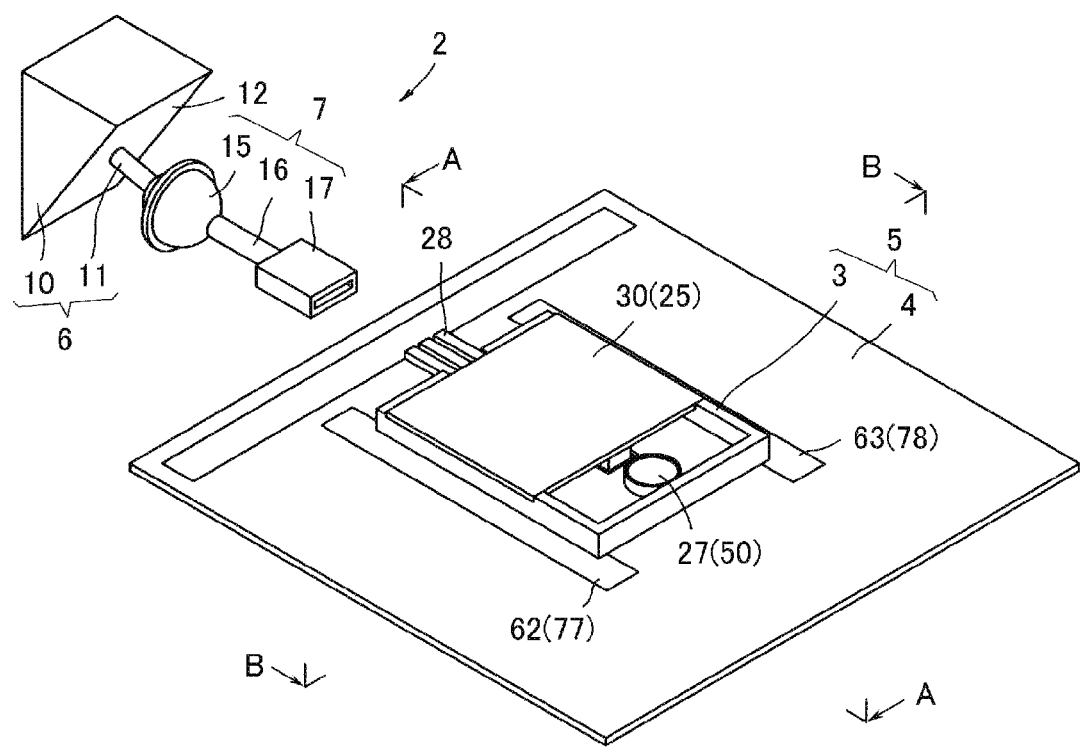
FIG. 3 is an explanatory diagram of the light-emitting module attachment structure of FIG. 2, specifically, an exploded perspective view in which the light-emitting module is detached from a fixture.

As can be seen from FIGS. 2 and 3, the fitted part 17 is fittable with a connection fitting part 28 of the light-emitting module 5.

As illustrated in FIG. 4, the fitted part 17 is a box-shaped body open in one direction and includes, inside thereof, an insertion space 20 into which the connection fitting part 28 can be inserted. That is, one end of the fitted part 17 forms an open end.

The fitted part 17 includes a fixing side connection terminal 23 which is electrically connected to an external power source and an external device and disposed in the insertion space 20. The fixing side connection terminal 23 serves as both a power supply terminal that supplies power from the external power source to a circuit board 25 (control board) illustrated in FIG. 5 and a signal input terminal that inputs a control signal from the external device to the circuit board 25.

The fitted part 17 is provided with, inside thereof, a push-push type ejection mechanism.

In the ejection mechanism, the connection fitting part 28 is locked by pushing the connection fitting part 28 into the insertion space 20, and the lock is released by again pushing the connection fitting part 28 so that the connection fitting part 28 can be ejected from the insertion space 20.

As illustrated in FIG. 5, the light-emitting module 5 includes the connector 3 and a light-emitting panel 4.

The module attachment structure 1 of the present embodiment has one of its characteristics in electrical and physical connection relationships between the connector 3 and the light-emitting panel 4. Thus, the structures of the connector 3 and the light-emitting panel 4 will be described in more detail.

Figure 6:
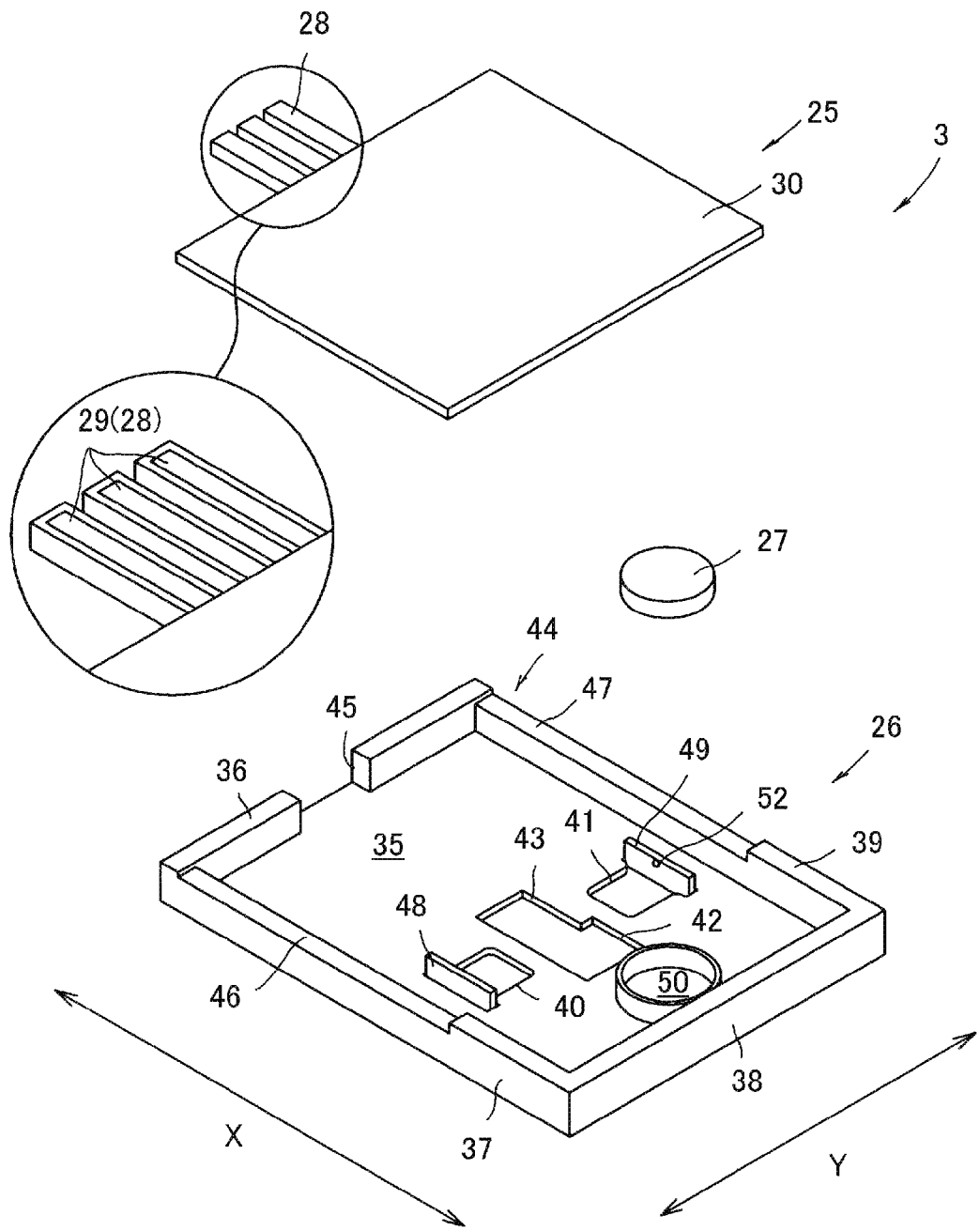
FIG. 6 is an exploded perspective view of the connector of FIG. 5.

As illustrated in FIG. 6, the connector 3 includes the circuit board 25 (control board), a connector base 26, and a magnet part 27 (second attraction part).

The circuit board 25 is a printed circuit board (PCB) that includes a plate-like or film-like circuit base material 30 (connection side base material) and a connection side circuit 31 (refer to FIG. 13, described below) mounted on the circuit base material 30.

In the present embodiment, the circuit board 25 is a single-sided board in which the connection side circuit 31 (refer to FIG. 13) is mainly mounted on one face of the plate-like circuit base material 30.

The circuit base material 30 is formed of epoxy resin or ceramic. The connection side circuit 31 of the circuit board 25 will be described in detail below.

As illustrated in FIG. 6, the circuit board 25 includes the connection fitting part 28.

The connection fitting part 28 is a projecting piece that is integrally fixed to the circuit base material 30 and projects in the in-plane direction from an end of the circuit base material 30. The connection fitting part 28 is fittable with the fitted part 17 of the fixing side fitting part 7.

The connection fitting part 28 includes a connection side connection terminal 29 (power supply part) which is electrically connected to the connection side circuit 31 (control circuit).

The connection side connection terminal 29 is connected to the fixing side connection terminal 23 when the connection fitting part 28 and the fitted part 17 are fitted with each other. That is, the connection side connection terminal 29 serves as both a power supply terminal that supplies power to the connection side circuit 31 by the supply of power from the fixing side connection terminal 23 and a signal input terminal that inputs a control signal from the fixing side connection terminal 23 to the connection side circuit 31.

The connector base 26 is a mount on which the circuit board 25 can be mounted as illustrated in FIG. 5 and formed of an insulator. Although a method for forming the connector base 26 is not particularly limited to any method, the connector base 26 is preferably formed by injection molding.

As illustrated in FIG. 6, the connector base 26 is provided with a base body 44, locking pieces 48, 49 (engagement pieces), and a magnet housing part 50.

The base body 44 is a dish-like member and includes a substantially quadrangular bottom face forming part 35 and side face forming parts 36, 37, 38, 39 which rise from four sides of the bottom face forming part 35.

The bottom face forming part 35 is provided with fitting through holes 40, 41 (support holes), a control side through hole 42, and a power supply side through hole 43 (housing through hole). All of these through holes 40, 41, 42, 43 penetrate the bottom face forming part 35 in the thickness direction.

The control side through hole 42 and the power supply side through hole 43 are adjacent to each other in the in-plane direction and partially continuous with each other. That is, the control side through hole 42 and the power supply side through hole 43 form a single through hole within the plane and are continuous with each other in the in-plane direction of the bottom face forming part 35.

The fitting through holes 40, 41 are formed at positions that face each other across the control side through hole 42 and the power supply side through hole 43 in a direction intersecting (perpendicular to, in the present embodiment) an aligned-arrangement direction of the control side through hole 42 and the power supply side through hole 43.

The control side through hole 42 is capable of housing a second terminal 83 (refer to FIG. 5) inside thereof. That is, the control side through hole 42 forms a power supply housing part capable of housing the second terminal 83.

The power supply side through hole 43 is capable of housing an adjustment element 81 and a first terminal 82 (refer to FIG. 5). That is, the power supply side through hole 43 forms a control housing part capable of housing the adjustment element 81 and the first terminal 82.

As illustrated in FIG. 6, the side face forming part 36 includes a cutout part 45 into which the connection fitting part 28 can be inserted. The cutout part 45 is cutout from a projecting direction end toward a base end of the side face forming part 36. The cutout part 45 is located on the center in a width direction Y of the side face forming part 36.

In each of the side face forming parts 37, 39, a projecting direction end thereof is partially cutout to form a step on a projecting direction end face. That is, the side face forming parts 37, 39 respectively include recesses 46, 47 each of which is recessed compared to the other part.

As can be seen from FIGS. 5 and 6, the width of each of the recesses 46, 47 is substantially equal to the width of the circuit base material 30 of the circuit board 25, and the recesses 46, 47 are capable of fixing the circuit base material 30 of the circuit board 25.

The locking pieces 48, 49 have a thin plate-like shape and respectively include hemispherical locking projections 51, 52 (wall side engagement parts) on their side faces in a proximity direction.

Figure 7:
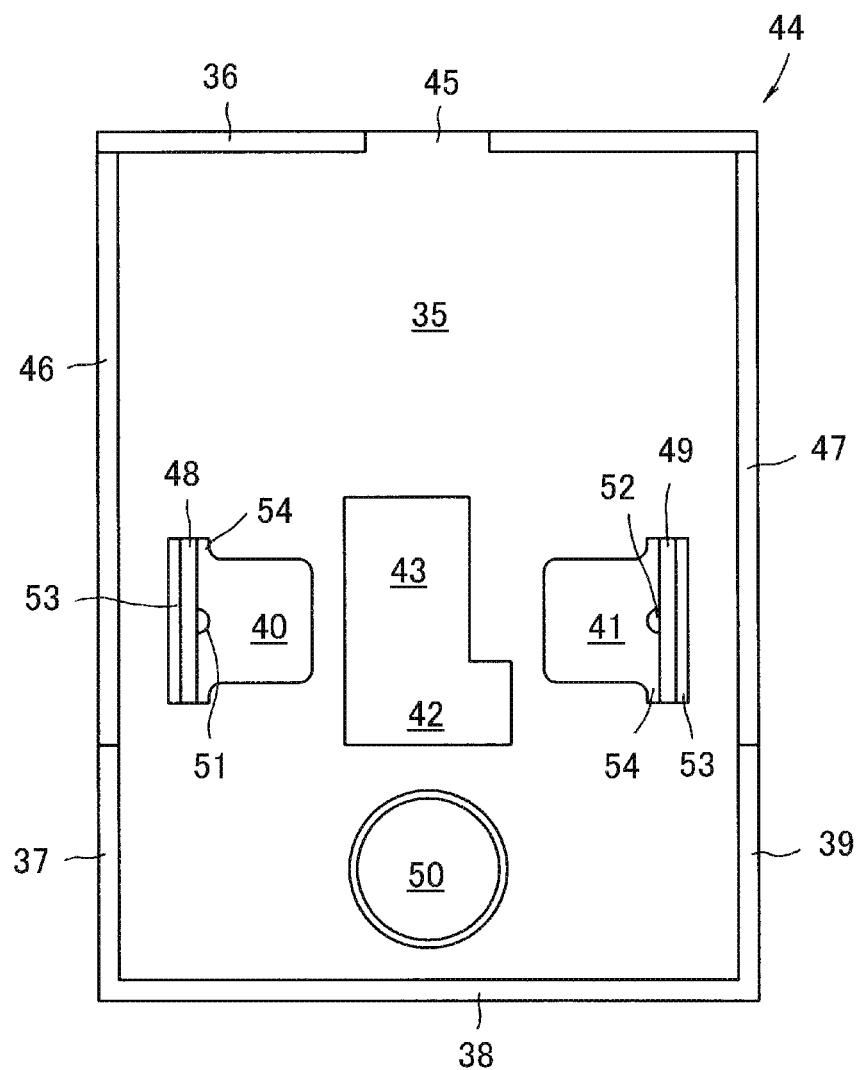
FIG. 7 is a plan view of a connector base of FIG. 6.

As illustrated in FIG. 7, a part of the locking piece 48 is located inside the fitting through hole 40, and a part of the locking piece 49 is located inside the fitting through hole 41. Both ends of the locking pieces 48 and 49 are fixed to the bottom face forming part 35. Specifically, each of the locking pieces 48, 49 is integrally connected to a part of the bottom face forming part 35, and both ends thereof are supported by the connection part therebetween so as to be in an upright orientation.

From another point of view, as illustrated in FIG. 7, the locking piece 48 is formed across the fitting through hole 40 to divide the fitting through hole 40, and the locking piece 49 is formed across the fitting through hole 41 to divide the fitting through hole 41. In other words, each of the locking pieces 48, 49 is sandwiched between slit-like grooves 53, 54. That is, since there is a space around each of the locking pieces 48, 49 in the thickness direction, the locking pieces 48, 49 have bending flexibility. Thus, each of the locking pieces 48, 49 is elastically deformable toward the space.

The locking pieces 48, 49 project with respect to the bottom face forming part 35 in the thickness direction, and the locking projections 51, 52 are formed near ends in the projecting direction of the locking pieces 48, 49.

The magnet housing part 50 is a tubular part into which the magnet part 27 can be inserted and attached and one side of which is closed by the bottom face forming part 35 as illustrated in FIG. 6. That is, the magnet housing part 50 can also be regarded as a bottomed hole which is surrounded by a cylindrical wall disposed in a standing manner on the bottom face forming part 35 and has the bottom face forming part 35 as a bottom thereof.

The magnet part 27 is a known permanent magnet and has a disk-like shape.

Here, a positional relationship between the parts when the connector 3 is assembled will be described.

As illustrated in FIG. 5, the circuit board 25 is fixed to the connector base 26. As can be seen from FIGS. 5 and 6, the circuit base material 30 is fixed to the recesses 46, 47 with the connection side circuit 31 (refer to FIG. 13) facing the bottom face forming part 35. As illustrated in FIG. 5, one face (the face located opposite to the connection side circuit 31) of the circuit base material 30 is flush with a projecting direction end of each of the side face forming parts 37, 39. In the circuit board 25, the magnet part 27 is inserted in and attached to the magnet housing part 50.

Figure 8:
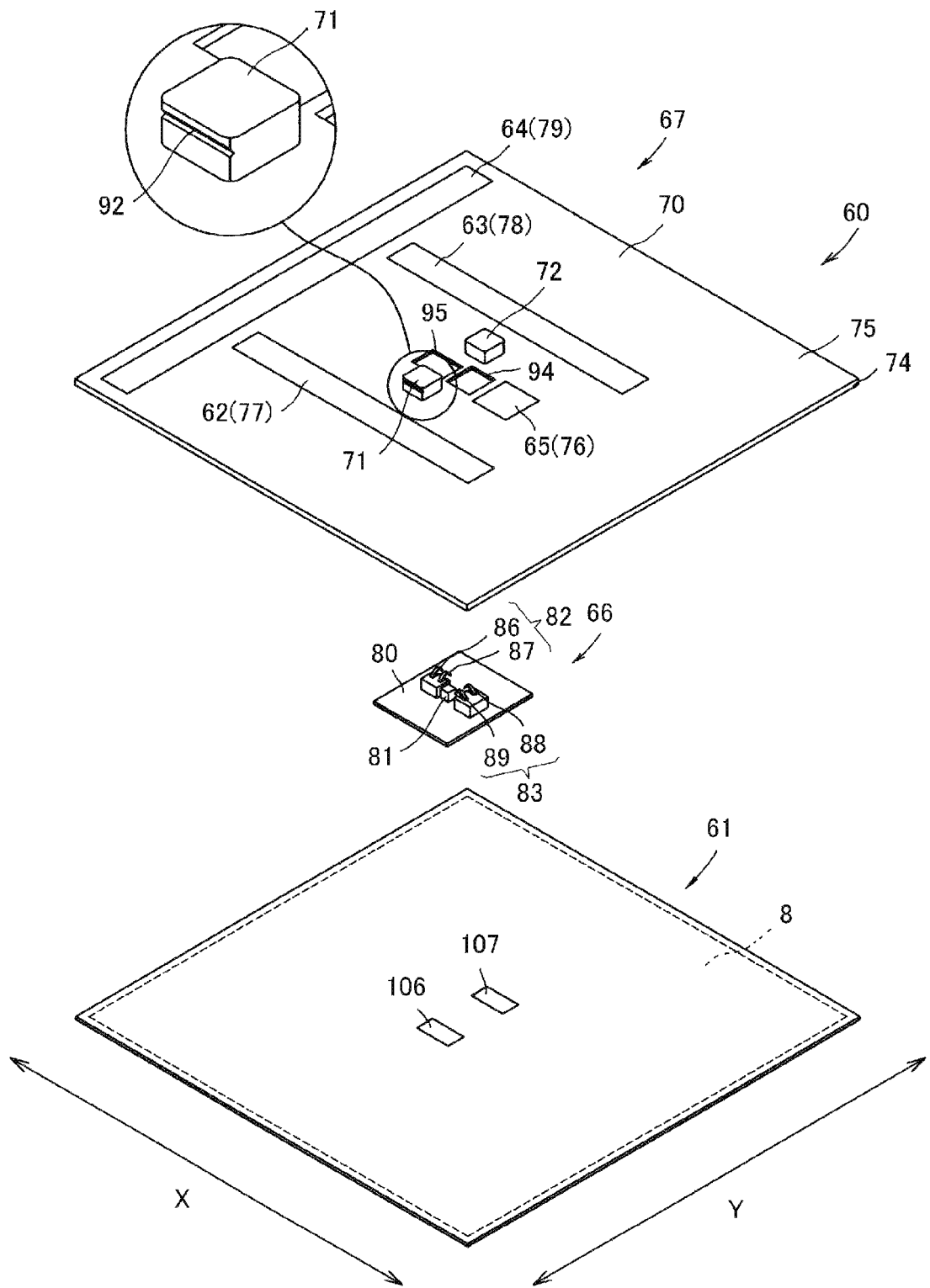
FIG. 8 is an exploded perspective view of the light-emitting panel of FIG. 5.

As illustrated in FIG. 8, the light-emitting panel 4 includes a frame member 60 and an organic EL panel 61 (panel body).

The frame member 60 functions as a frame of the organic EL panel 61 and fixes the organic EL panel 61 to the connector 3.

Figure 9:
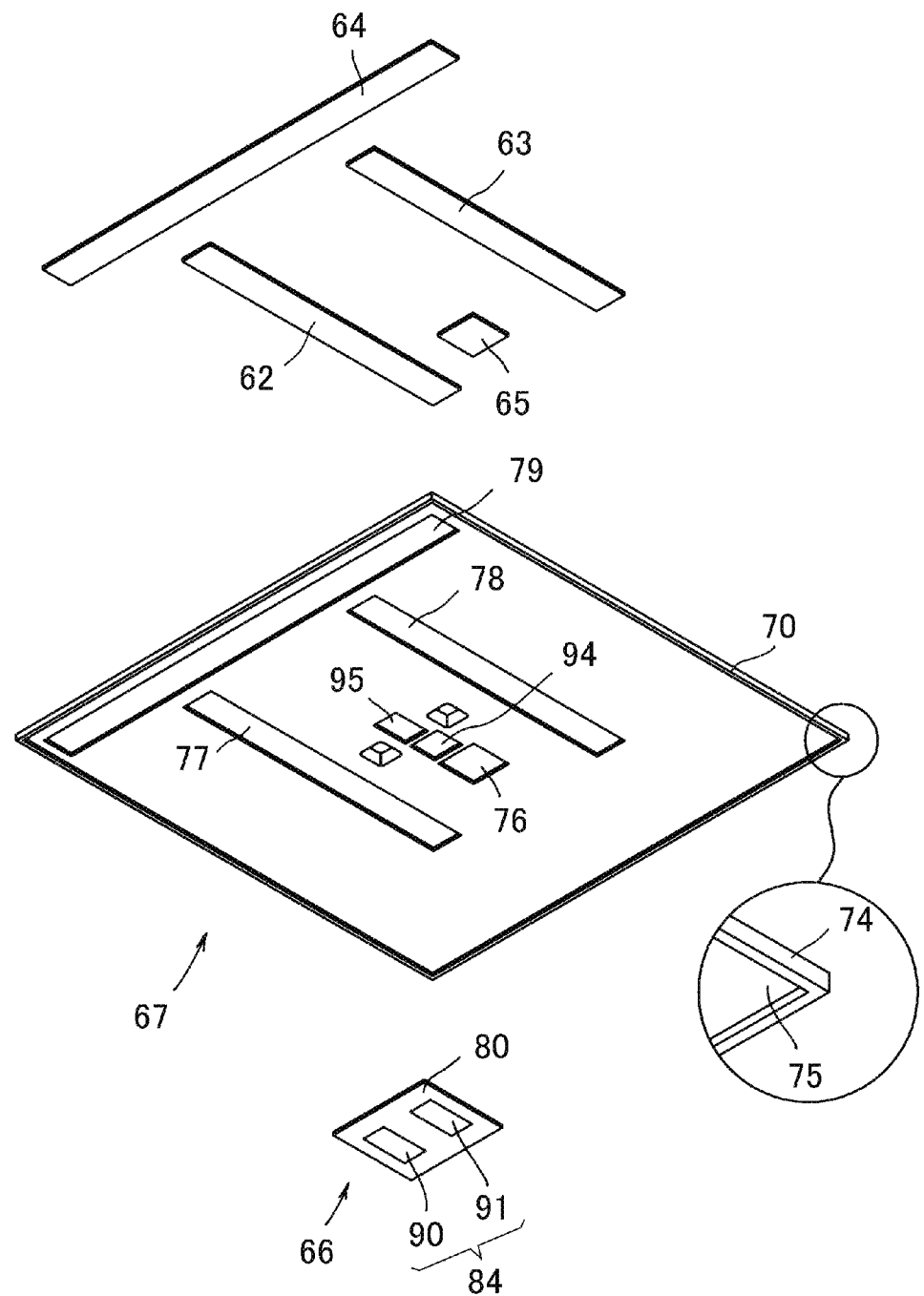
FIG. 9 is an exploded perspective view of a frame member of FIG. 8 viewed from an angle different from the angle of FIG. 8.

As illustrated in FIG. 9, the frame member 60 includes a frame body 67, reinforcement members 62, 63, 64, a ferromagnetic body 65 (first attraction part), and a power supply board 66.

The frame body 67 is formed of flexible resin, and includes a casing part 70 and panel side projections 71, 72 (projections) as illustrated in FIG. 8.

Figure 10:
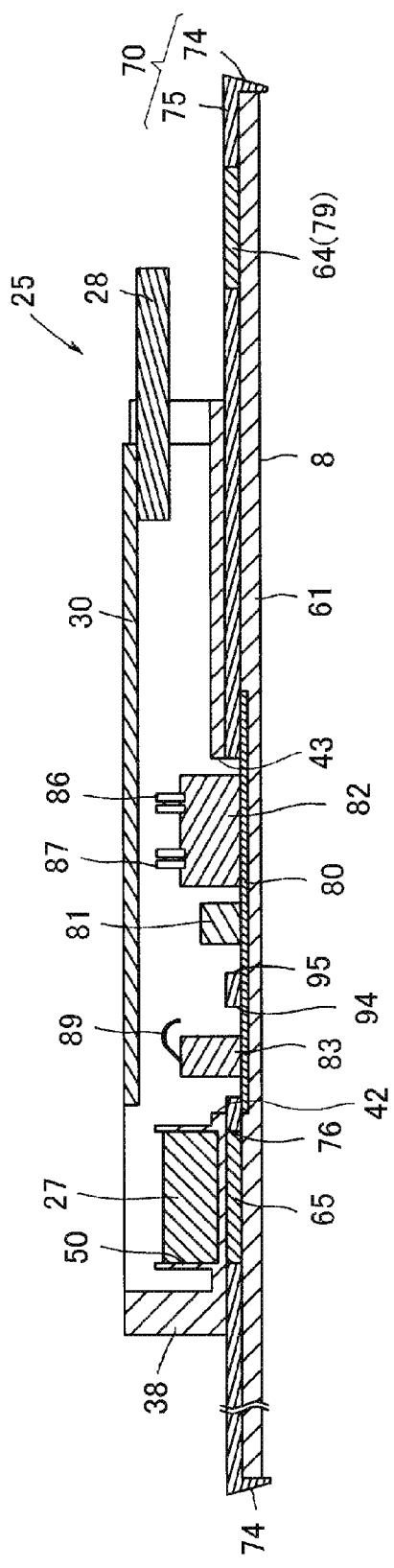
FIG. 10 is a sectional view of the light-emitting module taken along line A-A of FIG. 3.
Figure 11:
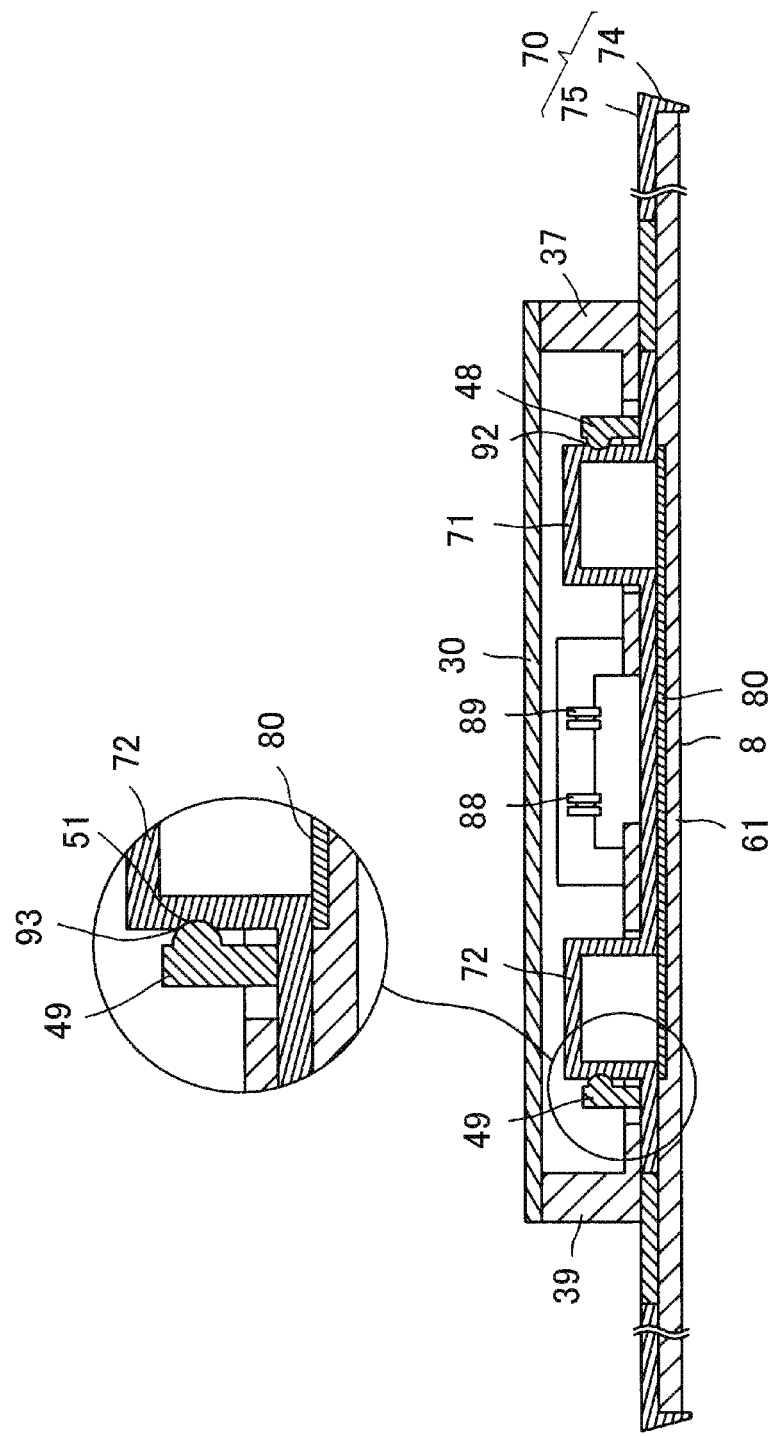
FIG. 11 is a sectional view of the light-emitting module taken along line B-B of FIG. 3.

As illustrated in FIGS. 10 and 11, the casing part 70 has a substantially "L"-shaped cross section near an end thereof and includes an end face cover part 74 and a back face side cover part 75. That is, the end face cover part 74 is formed in a standing manner from a peripheral end of the back face side cover part 75.

The end face cover part 74 covers the peripheral end face of the organic EL panel 61 when the light-emitting panel 4 is assembled. The back face side cover part 75 covers the back face (the face located opposite to an emission surface 8) of the organic EL panel 61 when the light-emitting panel 4 is assembled.

As can be seen from FIGS. 8 and 9, the back face side cover part 75 includes a power supply insertion hole 95 (insertion hole) into which the first terminal 82 can be inserted and a control insertion hole 94 (insertion hole) into which the second terminal 83 can be inserted.

The control insertion hole 94 is a through hole having substantially the same opening area as the control side through hole 42 (refer to FIG. 7).

The power supply insertion hole 95 is a through hole having substantially the same opening area as the power supply side through hole 43 (refer to FIG. 7).

As can be seen from FIGS. 8 and 9, the back face side cover part 75 includes the panel side projections 71, 72, a magnetic body housing part 76, and reinforcement member housing parts 77, 78, 79.

As illustrated in FIG. 8, the panel side projections 71, 72 are projecting pieces that project from the back face side cover part 75.

As can be seen from FIGS. 8 and 11, the panel side projections 71, 72 respectively include locking grooves 92, 93 (projecting side engagement parts) on their outer side faces in the aligned arrangement direction (longitudinal direction Y). That is, the side faces on which the panel side projections 71, 72 are formed face opposite to each other.

Each of the locking grooves 92, 93 is a long groove having a V-shaped cross section. That is, the inner side face of each of the locking grooves 92, 93 has a tapered shape downward inclined toward the center in the width direction of each of the locking grooves 92, 93.

The locking grooves 92, 93 are formed across the side faces of the panel side projections 71, 72 and extend in the transverse direction X.

As illustrated in FIG. 8, the magnetic body housing part 76 is capable of housing the ferromagnetic body 65.

The reinforcement member housing parts 77, 78, 79 are capable of housing the reinforcement members 62, 63, 64, respectively.

The reinforcement members 62, 63, 64 are reinforcing plates which reinforce both the stiffness of the frame body 67 and the stiffness of the organic EL panel 61. All the reinforcement members 62, 63, 64 are reinforcing plates having a long plate-like shape.

The material of the reinforcement member 62 is not particularly limited to any material as long as it is capable of reinforcing the stiffness of the organic EL panel 61. Examples of the material of the reinforcement member 62 include simple metals such as aluminum, iron, nickel, cobalt, and gadolinium, alloys of these metals, and oxides of these metals.

The reinforcement member 62 of the present embodiment is formed of an iron plate.

The reinforcement members 62, 63, 64 are rectangular long plates and extend in a band shape.

The ferromagnetic body 65 is a member that has ferromagnetism and receives a magnetic force generated by the magnet part 27. Specifically, the ferromagnetic body 65 is a metal piece having ferromagnetism. An iron plate is employed as the ferromagnetic body 65 of the present embodiment.

The power supply board 66 is a thin plate-like or sheet-like printed circuit board. In the present embodiment, the power supply board 66 is a flexible printed circuit board.

The power supply board 66 includes a power supply base material 80 and internal wiring (not illustrated) such as printed wiring is mounted on the power supply base material 80.

The power supply board 66 is provided with the adjustment element 81, the first terminal 82 and the second terminal 83 which are disposed on one face side of the power supply base material 80 as illustrated in FIG. 8 and provided with a third terminal 84 which is disposed on the other face side thereof as illustrated in FIG. 9.

The adjustment element 81 is capable of adjusting an adjustment factor according to the characteristics of an organic EL element 100. The adjustment element 81 of the present embodiment is a resistor capable of adjusting an electric resistance value. Specifically, the adjustment element 81 of the present embodiment is a semi-fixed resistor capable of changing an electric resistance value by an external element such as a driver.

As illustrated in FIG. 8, the first terminal 82 includes a first power supply terminal 86 and a second power supply terminal 87.

The first power supply terminal 86 and the second power supply terminal 87 are arranged side by side in the transverse direction X.

The second terminal 83 includes a first control terminal 88 and a second control terminal 89.

The first control terminal 88 and the second control terminal 89 are arranged side by side in a direction (longitudinal direction Y) perpendicular to the transverse direction X.

As illustrated in FIG. 9, the third terminal 84 includes a third power supply terminal 90 and a fourth power supply terminal 91.

A positional relationship between the constituent members of the frame member 60 will be described.

As illustrated in FIG. 8, the panel side projections 71, 72 of the frame member 60 are located on a principal surface opposite to the emission surface 8 of the organic EL panel 61. That is, in the entire light-emitting panel 4, the emission surface 8 is located on one principal surface (light-emitting side principal surface) of the light-emitting panel 4, and the panel side projections 71, 72 are located on the other principal surface (back face side principal surface).

The panel side projections 71, 72, the magnetic body housing part 76, the control insertion hole 94, and the power supply insertion hole 95 are locally mounted in an integrated manner within a predetermined range in plan view of the light-emitting panel 4.

Specifically, in plan view of the light-emitting panel 4, the panel side projections 71, 72, the magnetic body housing part 76, the control insertion hole 94, and the power supply insertion hole 95 all fit within an installation region that has a shape similar to the light-emitting panel 4 and centered on the center of the light-emitting panel 4 and has half the area of the light-emitting panel 4.

In plan view of the light-emitting panel 4, the panel side projections 71, 72, the magnetic body housing part 76, the control insertion hole 94, and the power supply insertion hole 95 preferably fit within an installation region having quarter the area of the light-emitting panel 4, and more preferably fit within an installation region having one-eighth of the area of the light-emitting panel 4.

As illustrated in FIG. 8, in the frame member 60, the power supply insertion hole 95, the control insertion hole 94, and the ferromagnetic body 65 are arranged in a row in this order in the transverse direction X. In the longitudinal direction Y (the direction perpendicular to both the transverse direction and a thickness direction Z), the panel side projections 71, 72 are located on the outer side with respect to the power supply insertion hole 95, the control insertion hole 94, and the ferromagnetic body 65. The reinforcement members 62, 63 are disposed on the outer side in the longitudinal direction Y with respect to the panel side projections 71, 72. The reinforcement member 64 is located on the outer side in the transverse direction X with respect to the reinforcement members 62, 63.

As illustrated in FIG. 8, both of the reinforcement members 62, 63 extend in the transverse direction X.

The reinforcement members 62, 63 are disposed with a predetermined space therebetween and parallel to each other in the longitudinal direction Y.

The reinforcement member 64 extends in a direction that intersects the extending direction of the reinforcement members 62, 63. In the present embodiment, the reinforcement member 64 extends in the longitudinal direction Y The reinforcement member 64 is located on the outer side (the end side) with respect to the reinforcement members 62, 63 in the transverse direction X. The reinforcement member 64 extends from the vicinity of one end to the vicinity of the other end in the longitudinal direction Y.

All the reinforcement members 62, 63, 64 are laid on the same plane.

Figure 12:
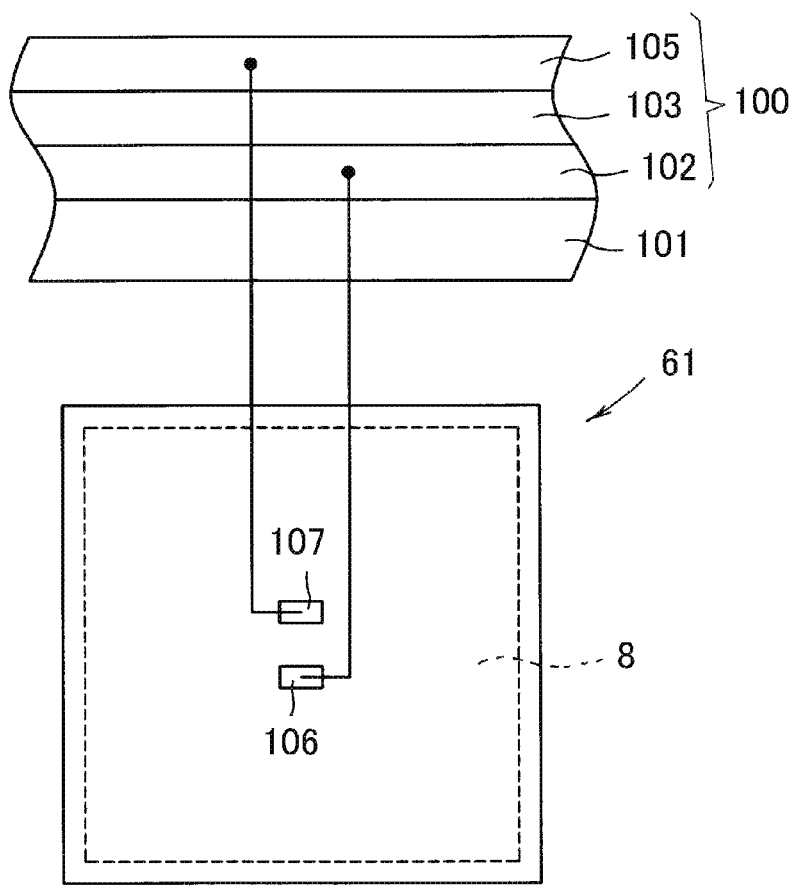
FIG. 12 is a schematic view illustrating a correspondence relationship between panel side power supply parts and each layer of an organic EL element in an organic EL panel of FIG. 8.

As illustrated in FIG. 12, the organic EL panel 61 includes the built-in organic EL element 100 (light-emitting element) and the emission surface 8 formed on one principal surface (one face) thereof.

That is, as illustrated in the upper diagram of FIG. 12, the organic EL panel 61 has a built-in laminated structure that includes a substrate 101 having planar expansion and the organic EL element 100 which is laminated on the substrate 101.

The organic EL element 100 has a laminated structure that includes at least a first electrode layer 102, an organic light-emitting layer 103, and a second electrode layer 105 which are laminated in this order from the substrate 101.

The organic EL panel 61 of the present embodiment is a bottom emission type organic EL panel which extracts light from the side having the substrate 101.

The organic EL panel 61 is a polygonal panel. In the present embodiment, the organic EL panel 61 is a quadrangular plate-like panel.

As can be seen from FIG. 8, the organic EL panel 61 includes panel side power supply parts 106, 107 on the back face (the face located opposite to the side having the emission surface 8, the upper face). That is, in the organic EL panel 61, the substrate 101 is located at the side having the emission surface 8, and the second electrode layer 105 is located at the side having the panel side power supply parts 106, 107.

As illustrated in FIG. 12, the panel side power supply part 106 is electrically connected to the first electrode layer 102 of the organic EL element 100, and the panel side power supply part 107 is electrically connected to the second electrode layer 105 of the organic EL element 100. Inside the organic EL panel 61, a conductive path connecting the panel side power supply part 106 to the panel side power supply part 107 through the first electrode layer 102, the organic light-emitting layer 103, and the second electrode layer 105 is formed. Thus, in the organic EL panel 61, the organic light-emitting layer 103 emits light and the emission surface 8 thereby emits light by application of voltage across the panel side power supply parts 106, 107.

Figure 13:
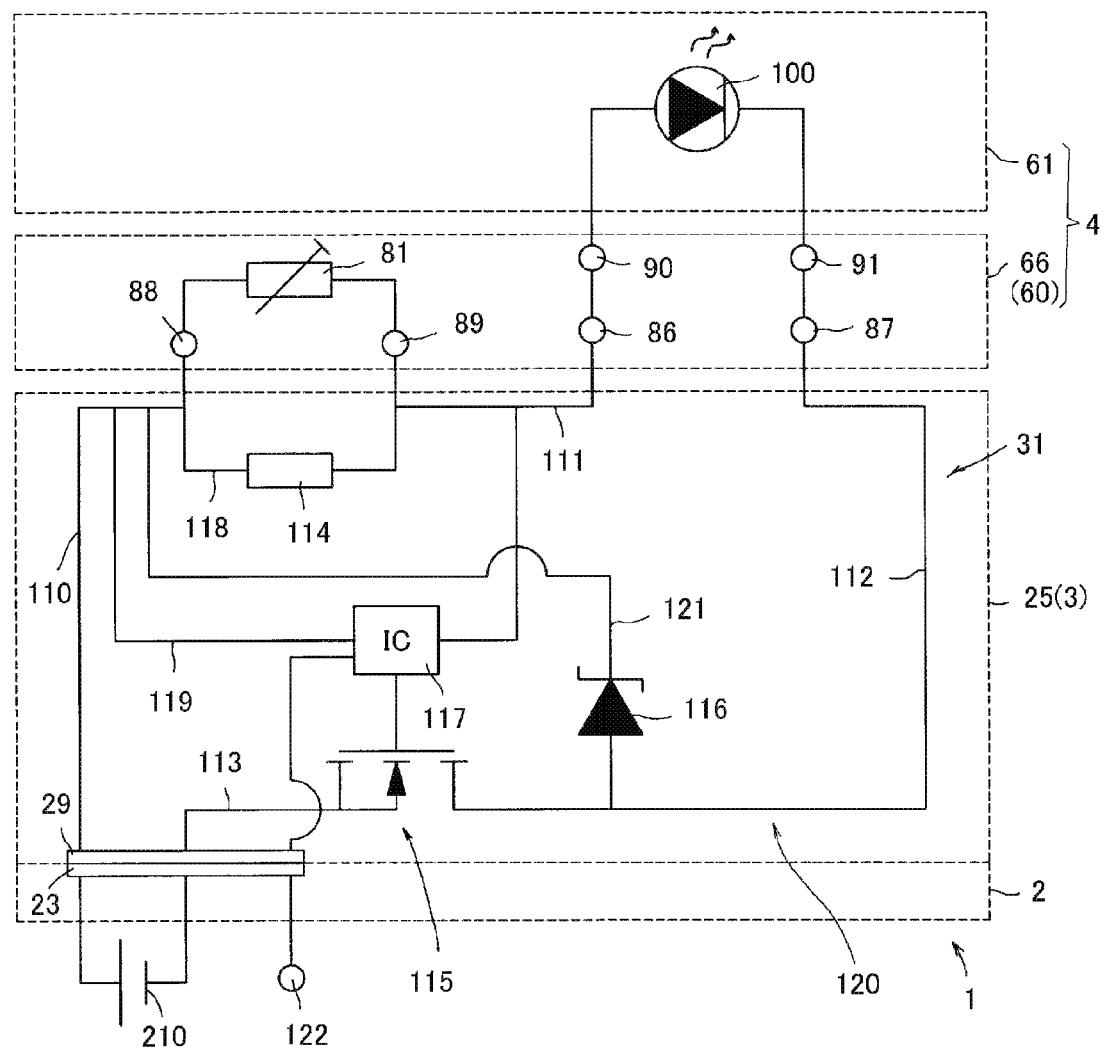
FIG. 13 is a circuit diagram illustrating an electric circuit inside the light-emitting module of FIG. 2 in a simplified manner and illustrating a state in which the light-emitting module attachment structure is formed and an external power source is connected thereto.

Next, an electric circuit inside the light-emitting module 5 which is one of the characteristics of the present embodiment will be described. FIG. 13 illustrates, in a simplified manner, the electric circuit constructed in the light-emitting module attachment structure 1 of the present embodiment.

The light-emitting module 5 is driven by the supply of current from an external power source 210.

The organic EL panel 61 is provided with the organic EL element 100.

The power supply board 66 is provided with the adjustment element 81.

The circuit board 25 mounts thereon the connection side circuit 31 and mainly includes a sense resistor 114, a field effect transistor 115, a voltage regulator diode 116, and an IC controller 117.

The sense resistor 114 is a known chip resistor and has a resistance extremely larger than a resistance that can be set in the adjustment element 81. The sense resistor 114 may be a combined resistor of a plurality of resistors.

The field effect transistor 115 is provided with a drain, a gate, and a source. In the present embodiment, the field effect transistor 115 is an N-channel MOSFET.

The voltage regulator diode 116 is a known Zener diode.

The IC controller 117 is a part that is capable of detecting current and transmitting a control signal to the field effect transistor 115.

The external power source 210 is a direct-current (DC) power source. In the present embodiment, a stabilized DC power source is used as the external power source 210.

An electrical connection relationship between these devices will be described with reference to FIG. 13.

The external power source 210 is connected to the connection side connection terminal 29 of the connector 3 through the fixing side connection terminal 23 of the fixture 2. The connection side connection terminal 29 is connected to the first control terminal 88 of the power supply board 66 through a first circuit side path 110 (supply side power supply path) of the circuit board 25. The first control terminal 88 is connected to the adjustment element 81 through the internal wiring of the power supply board 66. The adjustment element 81 is connected to the second control terminal 89 through the internal wiring of the power supply board 66. That is, the first control terminal 88 is electrically connected in series to the second control terminal 89 through the adjustment element 81.

The second control terminal 89 is connected to the first power supply terminal 86 of the power supply board 66 through a second circuit side path 111 (circuit side power supply path) of the circuit board 25. The first power supply terminal 86 is connected to the third power supply terminal 90 located on the face opposite thereto through the internal wiring of the power supply board 66. The third power supply terminal 90 is connected to the fourth power supply terminal 91 through the organic EL element 100. The fourth power supply terminal 91 is connected to the second power supply terminal 87 located on the face opposite thereto through the internal wiring of the power supply board 66.

The second power supply terminal 87 is connected to the field effect transistor 115 through a third circuit side path 112 of the circuit board 25. The field effect transistor 115 is connected to the connection side connection terminal 29 through a fourth circuit side path 113. The connection side connection terminal 29 is connected to the external power source 210 through the fixing side connection terminal 23 of the fixture 2.

In this manner, the light-emitting module 5 forms a power supply circuit 120 in which the adjustment element 81, the organic EL element 100, and the field effect transistor 115 are connected in series in this order from the external power source.

The circuit board 25 includes a first bypass 118 (bypass) and a second bypass 119 (bypass) which connect the first circuit side path 110 and the second circuit side path 111 in a manner to bypass the adjustment element 81. The sense resistor 114 is connected to an intermediate part of the first bypass 118, and the IC controller 117 is connected to an intermediate part of the second bypass 119.

The adjustment element 81, the sense resistor 114, and the IC controller 117 have a parallel connection relationship with each other, and the parallel connection relationship therebetween constitutes a current detection circuit which detects a current between the first circuit side path 110 and the second circuit side path 111. That is, in the current detection circuit, the IC controller 117 detects a voltage between the first circuit side path 110 and the second circuit side path 111, and the current between the first circuit side path 110 and the second circuit side path 111 is detected from the composite resistance of the adjustment element 81 and the sense resistor 114.

The circuit board 25 includes a connection circuit 121 which connects the first circuit side path 110 and the third circuit side path 112 to each other. The voltage regulator diode 116 is connected to an intermediate part of the connection circuit 121. That is, the voltage regulator diode 116 makes a voltage between the first circuit side path 110 and the third circuit side path 112 constant and makes a current to be applied to the organic EL element 100 constant. That is, the circuit board 25 is provided with a stabilization circuit passing through the adjustment element 81, the sense resistor 114, the organic EL element 100, and the voltage regulator diode 116, and the stabilization circuit makes the current to be applied to the organic EL element 100 constant.

The IC controller 117 is connected to an external signal input unit 122 through the fixing side connection terminal 23 and the connection side connection terminal 29 and capable of receiving a control signal (external signal) for performing PWM control or on/off control from the signal input unit 122.

The IC controller 117 is connected to the gate of the field effect transistor 115 and capable of outputting a drive signal to the field effect transistor 115.

That is, the light-emitting module 5 outputs a drive signal to the field effect transistor 115 on the basis of a control signal received by the IC controller 117 from the signal input unit 122 to control the field effect transistor 115. Accordingly, it is possible to control the amount of power supplied to the organic EL element 100 to control dimming of the organic EL element 100.

Next, a positional relationship between the parts of the light-emitting module attachment structure 1 will be described according to a process of attaching the light-emitting module 5 to the installation target surface 200.

First, an assembly process of the light-emitting module 5 will be described.

Figure 14:
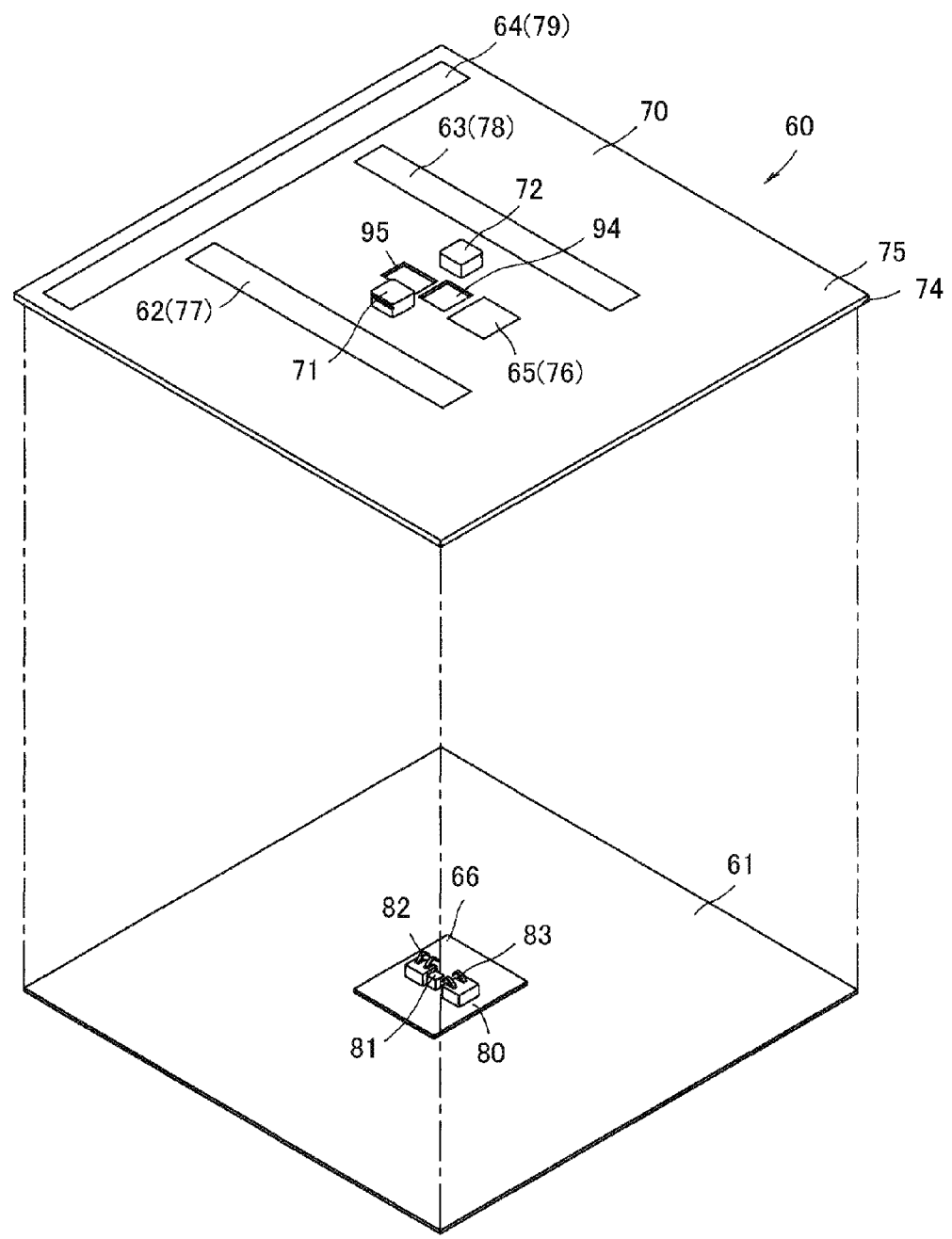
FIG. 14 is an explanatory diagram of an attachment process of the light-emitting module of FIG. 1, specifically, a perspective view when the frame member is attached to the organic EL panel.

As illustrated in FIG. 14, the frame member 60 is attached to the organic EL panel 61 with the power supply board 66 connected to form the light-emitting panel 4.

At this time, the back face side cover part 75 of the frame member 60 covers the face of the organic EL panel 61, the face being located opposite to the emission surface 8, and the end face cover part 74 covers the end face of the organic EL panel 61.

As can be seen from FIGS. 8 and 9, the third power supply terminal 90 of the third terminal 84 of the power supply board 66 is in contact with and physically connected to the panel side power supply part 106, and the fourth power supply terminal 91 thereof is in contact with and physically connected to the panel side power supply part 107.

Figure 15A:
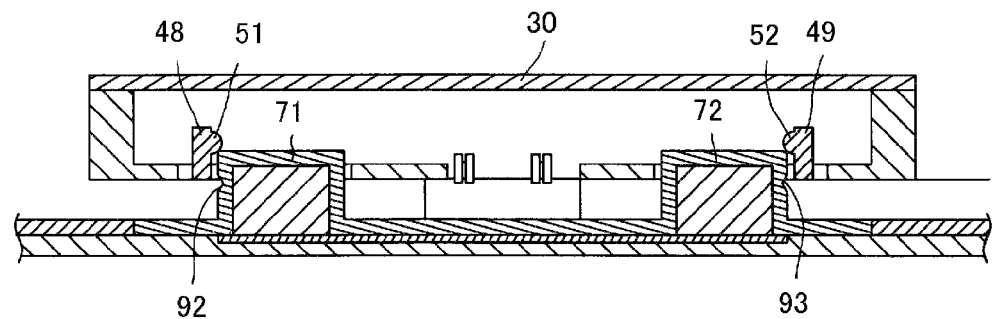
Figure 15B:
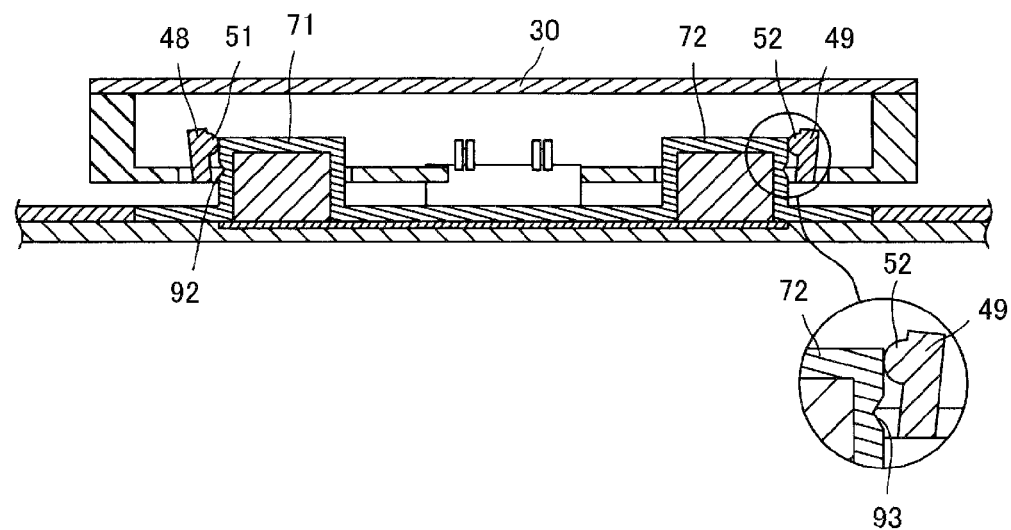
Figure 15C:
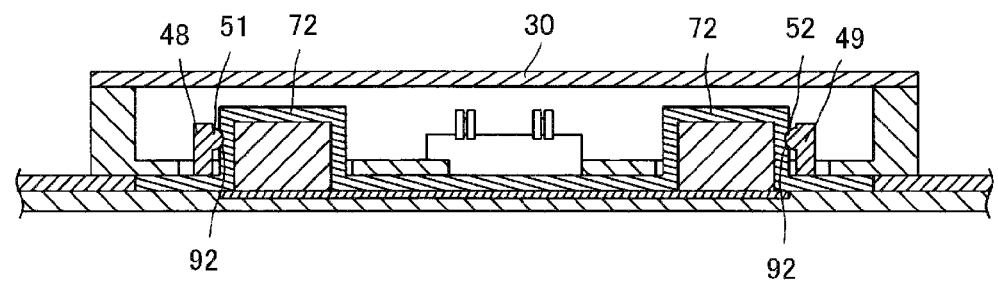

Then, as illustrated in FIGS. 15A - 15C, the light-emitting panel 4 is brought close to and attached to the connector base 26.

The light-emitting panel 4 is brought close to the connector 3 by the ferromagnetic body 65 attracted by the magnetic force of the magnet part 27. The bottom face forming part 35 which forms the bottom of the magnet housing part 50 is interposed between the magnet part 27 and the ferromagnetic body 65. That is, the magnet part 27 and the ferromagnetic body 65 are attracted to each other by the magnetic force through the bottom face forming part 35.

The locking pieces 48, 49 are pressed by the panel side projections 71, 72 and thereby elastically deformed outward as illustrated in FIGS. 15A and 15B, and then fitted into the locking grooves 92, 93 of the panel side projections 71, 72.

At this time, in the locking pieces 48, 49, a restoring force is generated by the elastic deformation toward the panel side projections 71, 72. That is, the locking pieces 48, 49 bias the panel side projections 71, 72 in directions coming close to each other. Further, the locking projections 51, 52 are fitted into the locking grooves 92, 93 by the biasing force, and a wedge effect by the locking grooves 92, 93 acts. Thus, the locking projections 51, 52 are less prone to come off the locking grooves 92, 93, and the light-emitting panel 4 is less prone to fall from the connector base 26.

Further, as can be seen from FIG. 10, the control side through hole 42 and the control insertion hole 94 communicate with each other to form a single communicating hole. That is, a housing space capable of housing the second terminal 83 is formed inside the communicating hole. The second terminal 83 is inserted through the communicating hole formed by the control side through hole 42 and the control insertion hole 94 and connected to the circuit board 25.

The power supply side through hole 43 and the power supply insertion hole 95 communicate with each other to form a single communicating hole. That is, a housing space capable of housing the first terminal 82 and the adjustment element 81 is formed inside the communicating hole. The first terminal 82 is inserted through the communicating hole formed by the power supply side through hole 43 and the power supply insertion hole 95 and connected to the circuit board 25.

Then, current is experimentally applied to the light-emitting panel 4, and the amount of current within the electric circuit is detected. As necessary, the electric resistance value of the adjustment element 81 is adjusted by an external element such as a driver.

Figure 16:
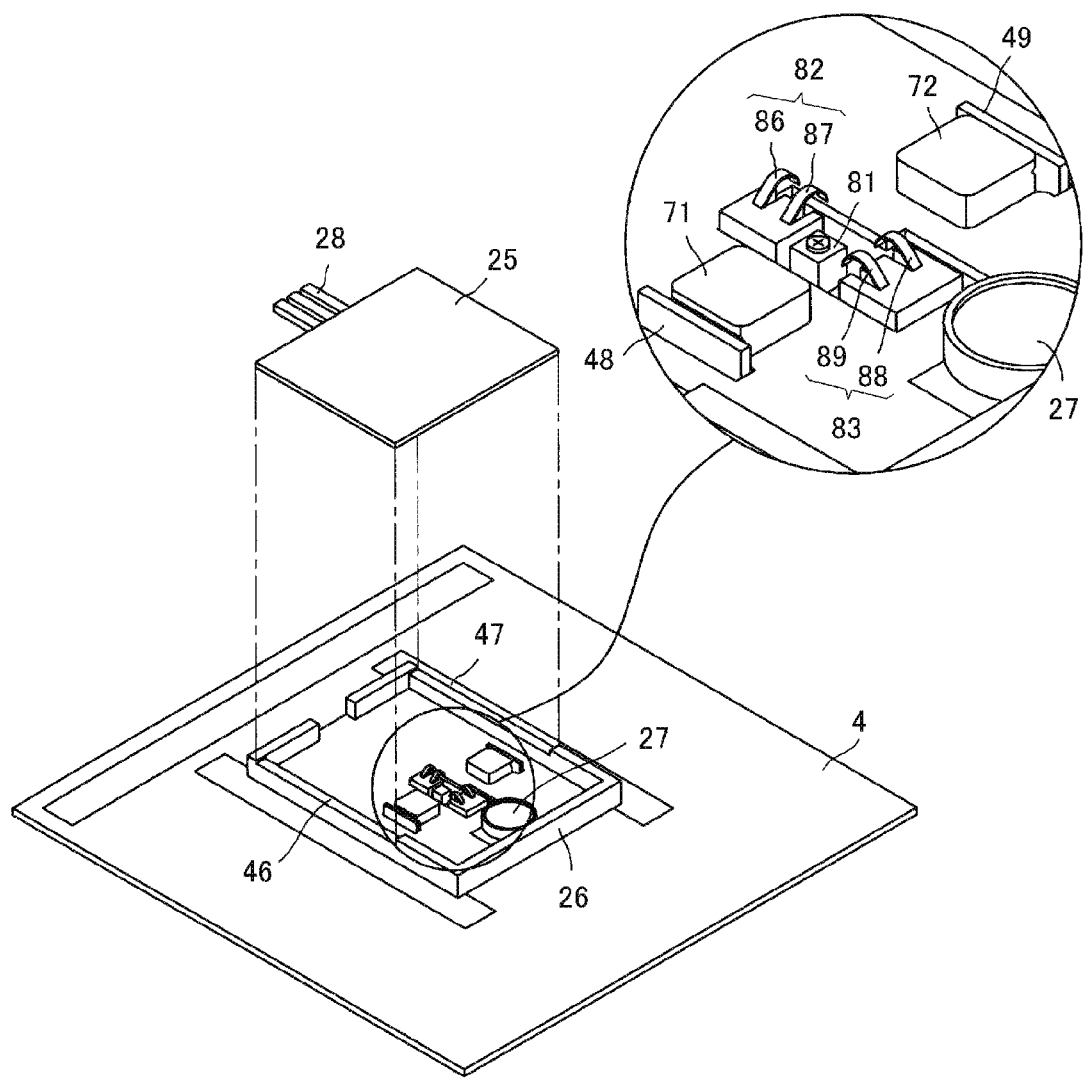
FIG. 16 is an explanatory diagram of the attachment process of the light-emitting module of FIG. 1, specifically, a perspective view when a circuit board is attached to the light-emitting panel.

Then, as illustrated in FIG. 16, the circuit board 25 is attached to the recesses 46, 47 to fix the circuit board 25 to form the light-emitting module 5.

The circuit board 25 is disposed so as to cover the first terminal 82, the second terminal 83, and the adjustment element 81 which are exposed from the connector base 26 at this time. That is, the circuit board 25 is disposed in such a manner that one face of the circuit base material 30 faces the back face of the light-emitting panel 4. Further, a large part of the connection side circuit 31 of the circuit board 25 faces the back face of the light-emitting panel 4.

As illustrated in FIG. 3, the magnet part 27 is not covered with the circuit board 25. Thus, the circuit board 25 is less prone to receive the influence of magnetic force by the magnet part 27.

The light-emitting module 5 is manufactured by performing the above steps.

Then, the light-emitting module 5 manufactured by the above steps is attached to the fixture 2.

Figure 17A:
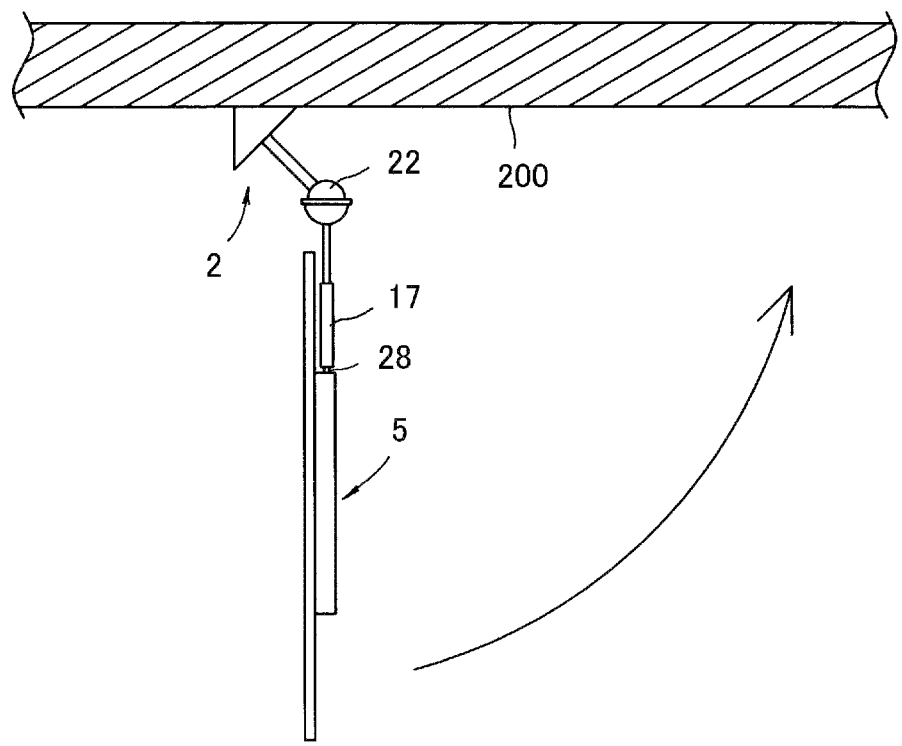

First, as illustrated in FIG. 17A, the fitted part 17 of the fixture 2 is brought into an orientation intersecting the installation target surface 200 (intersecting orientation), and the connection fitting part 28 of the circuit board 25 is inserted into the fitted part 17 and fixed thereto.

At this time, the fixing side connection terminal 23 inside the insertion space 20 of the fitted part 17 comes into contact with the connection side connection terminal 29 of the connection fitting part 28 and is connected thereto.

Figure 17B:
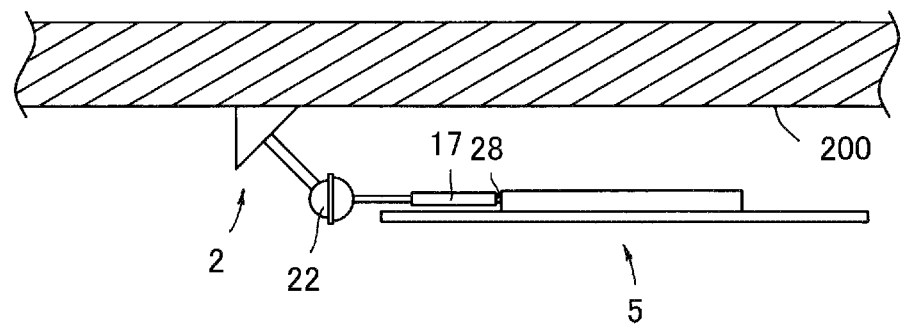

Then, the light-emitting module 5 is lifted toward the installation target surface 200 by turning the light-emitting module 5 around the ball part 22 as a turning center as indicated by an arrow in FIG. 17A and brought into an orientation parallel to the installation target surface 200 (parallel orientation) as illustrated in FIG. 17B.

When replacement with a new light-emitting module 5 is performed, the fitted part 17 of the fixture 2 is brought into an orientation interesting the installation target surface 200 by turning the fitted part 17 around the ball part 22 as the turning center, and the connection fitting part 28 of the circuit board 25 is pulled out of the fitted part 17 and detached therefrom.

Then, the connection fitting part 28 of the newly prepared light-emitting module 5 is fitted with the fitted part 17, and the light-emitting module 5 is lifted toward the installation target surface 200 by turning the light-emitting module 5 around the ball part 22 as the turning center and brought into the orientation parallel to the installation target surface 200.

According to the light-emitting module 5 of the present embodiment, since the devices on the circuit base material 30 of the circuit board 25 are covered with the circuit base material 30 and the insulating connector base 26, it is possible to prevent a user from touching the devices and a conductive part such as wiring on the circuit board 25.

According to the light-emitting module 5 of the present embodiment, since the locking grooves 92, 93 have a tapered shape, when the locking projections 51, 52 are fitted into the locking grooves 92, 93, a wedge effect acts. Thus, the locking projections 51, 52 are securely fitted in the locking grooves 92, 93, and the integration strength therebetween is high.

In the light-emitting panel 4 of the present embodiment, since a semi-fixed resistor is used as the adjustment element 81, the thickness of the adjustment element 81 is larger than the thickness of a common fixed resistor. Thus, a space for disposing the adjustment element 81 is required in the thickness direction projecting from the power supply base material 80 of the power supply board 66.

Thus, in the light-emitting module 5 of the present embodiment, the power supply side through hole 43 of the connector base 26 and the power supply insertion hole 95 of the frame member 60 form a housing space capable of housing the adjustment element 81. Thus, the installation place for the adjustment element 81 is ensured, and the adjustment element 81 does not become an obstacle for the attachment.

According to the light-emitting module attachment structure 1 of the present embodiment, the fixture 2 and the circuit board 25 of the connector 3 are electrically and mechanically connected to each other by the fitting relationship between the fixing side fitting part 7 and the connection fitting part 28. Conversely, the fixture 2 and the circuit board 25 of the connector 3 are electrically disconnected by releasing the fitting relationship between the fixing side fitting part 7 and the connection fitting part 28. Thus, it is not necessary to separately perform connection of wiring or the like when the light-emitting module 5 is attached to or detached from the fixture 2. Thus, a replacement operation for the light-emitting module 5 can be simplified.

According to the light-emitting module attachment structure 1 of the present embodiment, three members, specifically, the light-emitting panel 4, the connector 3, and the fixture 2 are attachable to and detachable from each other, and the three members control the light-emitting panel 4 in cooperation with each other.

Thus, for example, when the light-emitting panel 4 is broken, the broken light-emitting panel 4 can be replaced with a new light-emitting panel 4 to be used, and repair for the broken one is easy.

In order to change a method for controlling the light-emitting panel 4, the control method can be changed by replacing the connector 3.

Further, in order to change a method for fixing the fixture 2 to the installation target surface 200, the fixing method can be changed by changing the fixture 2.

Although, in the above embodiment, power is supplied from the external power source 210 to the adjustment element 81 of the power supply board 66 through the circuit board 25, the present invention is not limited thereto. There may be employed a structure that supplies power to the adjustment element 81 of the power supply board 66 directly from the external power source 210 without through the circuit board 25.

Although, in the above embodiment, the locking projections 51, 52 (projections) are provided in the locking pieces 48, 49 of the connector base 26, the locking grooves 92, 93 (recesses) are provided in the panel side projections 71, 72 of the frame member 60, and the locking projections 51, 52 and the locking grooves 92, 93 are engaged with each other, the present invention is not limited thereto. Recesses may be provided in the locking pieces 48, 49, projections may be provided in the panel side projections 71, 72, and the recesses and the projections may be engaged with each other.

Although, in the above embodiment, the connection fitting part 28 as a projection is provided in the circuit board 25 and fitted with the fitted part 17 as a recess provided in the fixture 2, the present invention is not limited thereto. A recess may be provided in the circuit board 25, a projection may be provided in the fixture 2, and the recess and the projection may be fitted with each other.

Although, in the above embodiment, the connection fitting part 28 is provided in the circuit board 25, the present invention is not limited thereto. The connection fitting part 28 may be provided in the connector base 26 as illustrated in FIG. 18.

Although, in the above embodiment, the fitting relationship between the connection fitting part 28 of the circuit board 25 and the fitted part 17 of the fixture 2 is used for both mechanical connection and electrical connection, the present invention is not limited thereto. The fitting relationship between the connection fitting part 28 of the circuit board 25 and the fitted part 17 of the fixture 2 may be used only for mechanical connection.

Although, in the above embodiment, the reinforcement members 62, 63, 64 are arranged on the same plane, the present invention is not limited thereto. The reinforcement members 62, 63, 64 may be slightly displaced from each other in the height direction. That is, the reinforcement members 62, 63, 64 are only required to have a relationship in which the reinforcement members 62, 63, 64 extend in directions intersecting each other when projected on the same plane.

Although, in the above embodiment, description has been made with reference to the drawings illustrating a case in which the light-emitting module 5 is laid on a ceiling, the present invention is not limited thereto. The installation position of the light-emitting module 5 is not limited to any position.

Although, in the above embodiment, the magnet part 27 is provided in the connector 3, and the ferromagnetic body 65 is provided in the light-emitting panel 4, the present invention is not limited thereto. The ferromagnetic body 65 may be provided in the connector 3, and the magnet part 27 may be provided in the light-emitting panel 4.

Although, in the above embodiment, the adjustment element 81 is inserted and housed in the power supply side through hole 43 and covered with the circuit base material 30 of the circuit board 25 to make the adjustment element 81 inoperable when the connector 3 is attached to the light-emitting panel 4, the present invention is not limited thereto. As illustrated in FIG. 19, a housing recess 220 may be formed on the connector base 26, and the adjustment element 81 may be housed in the housing recess 220 to make the adjustment element 81 inoperable when the connector 3 is attached to the light-emitting panel 4.

EXPLANATION OF REFERENCE CHARACTERS

1: light-emitting module attachment structure
2: fixture
3: connector
4: light-emitting panel
5: light-emitting module
7: fixing side fitting part
8: emission surface
25: circuit board
26: connector base
27: magnet part (second attraction part)
28: connection fitting part 30: circuit base material (connection side base material)
31: connection side circuit
40, 41: fitting through hole (support hole)
42: power supply side through hole
43: control side through hole (housing through hole)
44: base body
48, 49: locking piece (engagement piece)
51, 52: locking projection (wall side engagement part)
60: frame member
61: organic EL panel (panel body)
65: ferromagnetic body (first attraction part)
66: power supply board
71, 72: panel side projection (projection)
81: adjustment element
82: first terminal (power supply terminal)
83: second terminal (control terminal)
92, 93: locking groove (projecting side engagement part)
100: organic EL element (light-emitting element)
110: first circuit side path (supply side power supply path)
111: second circuit side path (circuit side power supply path)
118: first bypass (bypass)
119: second bypass (bypass)
200: installation target surface
220: housing recess

The invention claimed is:

1. A light-emitting module comprising:
a light-emitting panel having an emission surface; and
a connector for connecting the light-emitting panel to a fixture fixed on an installation target surface,
the connector being connected to the light-emitting panel,
the connector comprising a connection side circuit that includes a supply side power supply path and a circuit side power supply path both contributory to power supply to the light-emitting panel,
the light-emitting panel comprising:
an adjustment element capable of adjusting an electric resistance value; and
a light-emitting element,
wherein the supply side power supply path is electrically connected in series to the circuit side power supply path through the adjustment element, and
wherein the adjustment element is electrically connected in series to the light-emitting element through the circuit side power supply path.

2. The light-emitting module according to claim 1, wherein at least one of the supply side power supply path or the circuit side power supply path constitutes a control circuit that controls an amount of power supplied to the light-emitting element in response to an external signal.

3. The light-emitting module according to claim 1, wherein the connection side circuit comprises a bypass that bypasses the adjustment element and that connects the supply side power supply path with the circuit side power supply path, and
wherein the adjustment element constitutes a part of a current detection circuit that detects a current between the supply side power supply path and the circuit side power supply path.

4. The light-emitting module according to claim 1, wherein at least one of the supply side power supply path and the circuit side power supply path constitutes a stabilization circuit for making a current applied to the light-emitting element constant.

* * * * *